United States Patent
Kadota et al.

(10) Patent No.: US 12,401,342 B2
(45) Date of Patent: Aug. 26, 2025

(54) HIGH-ORDER MODE SURFACE ACOUSTIC WAVE DEVICES

(71) Applicant: TOHOKU UNIVERSITY, Sendai (JP)

(72) Inventors: Michio Kadota, Miyagi (JP); Shuji Tanaka, Miyagi (JP)

(*) Notice: Subject to any disclaimer, the term of this patent is extended or adjusted under 35 U.S.C. 154(b) by 938 days.

(21) Appl. No.: 17/600,756

(22) PCT Filed: Mar. 31, 2020

(86) PCT No.: PCT/JP2020/014906
§ 371 (c)(1),
(2) Date: Oct. 1, 2021

(87) PCT Pub. No.: WO2020/204045
PCT Pub. Date: Oct. 8, 2020

(65) Prior Publication Data
US 2022/0200566 A1    Jun. 23, 2022

(30) Foreign Application Priority Data
Apr. 3, 2019  (JP) .................. 2019-071405

(51) Int. Cl.
*H03H 9/145* (2006.01)
*H03H 9/02* (2006.01)
*H03H 9/25* (2006.01)

(52) U.S. Cl.
CPC ........ *H03H 9/145* (2013.01); *H03H 9/02559* (2013.01); *H03H 9/25* (2013.01)

(58) Field of Classification Search
CPC ...... H03H 9/145; H03H 9/02559; H03H 9/25; H03H 9/02574; H03H 9/02834;
(Continued)

(56) References Cited

U.S. PATENT DOCUMENTS 7,589,451 B2 *  9/2009  Morita ............... H03H 9/02551
                                          333/195
10,389,332 B2 *  8/2019  Bhattacharjee ........ H10N 30/08
(Continued)

FOREIGN PATENT DOCUMENTS

EP    2012/086441 A1    6/2012
JP    7-283682 A       10/1995
(Continued)

OTHER PUBLICATIONS

International Search Report for International Application No. PCT/JP2020/014906, dated Jun. 23, 2020.
(Continued)

*Primary Examiner* — Emily P Pham
(74) *Attorney, Agent, or Firm* — Chang & Hale LLP

(57) ABSTRACT

A high-order mode surface acoustic wave device includes a piezoelectric substrate (11) formed from a $LiTaO_3$ or $LiNbO_3$ crystal and an interdigital transducer electrode (12) embedded in a surface of the piezoelectric substrate (11) to use a surface acoustic wave in a high-order mode. Further, the high-order mode surface acoustic wave device may include a film (13) or substrate stacked on the piezoelectric substrate (11), and may include a support substrate (11) and/or a multi-layer film (15) provided in contact with a surface opposite to the surface of the piezoelectric substrate (11) on which the interdigital transducer electrode (12) is provided. The high-order mode surface acoustic wave device may achieve good characteristics and maintain a sufficient mechanical strength even in a high frequency band of 3.8 GHz or greater.

27 Claims, 20 Drawing Sheets

(58) Field of Classification Search
CPC ........... H03H 9/14538; H03H 9/14541; H03H 9/02543; H03H 9/131
See application file for complete search history.

(56) References Cited

U.S. PATENT DOCUMENTS

| | | | | |
|---|---|---|---|---|
| 10,469,052 | B2* | 11/2019 | Iwamoto | ................... H03H 9/72 |
| 2004/0093705 | A1* | 5/2004 | Nakao | ................... H03H 9/6436 29/25.35 |
| 2007/0132339 | A1* | 6/2007 | Nishiyama | ......... H03H 9/02929 310/313 R |

FOREIGN PATENT DOCUMENTS

| | | | |
|---|---|---|---|
| JP | 2013-214789 | A | 10/2013 |
| WO | 01/28090 | A1 | 4/2001 |
| WO | 2010/016192 | A1 | 2/2010 |
| WO | 2011/007690 | A1 | 1/2011 |

OTHER PUBLICATIONS

Translation of the International Search Report for International Application No. PCT/JP2020/014906, dated Jun. 23, 2020.
Written Opinion of the International Searching Authority for International Application No. PCT/JP2020/014906, dated Jun. 23, 2020.

* cited by examiner

[FIGS. 1(a)-1(c)]
(a) Prior Art
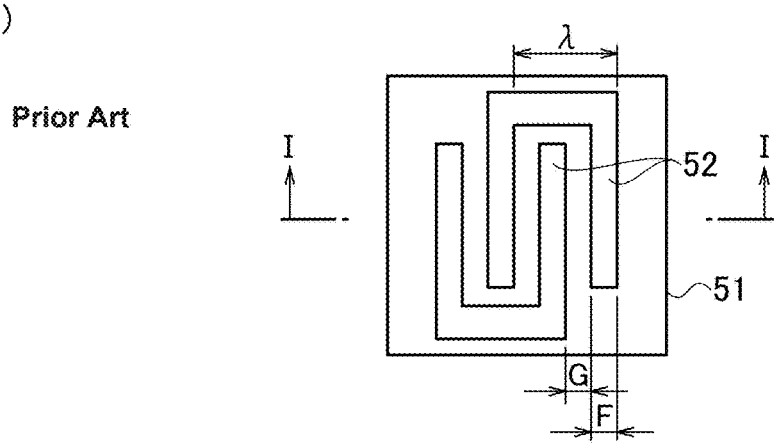
(b) Prior Art
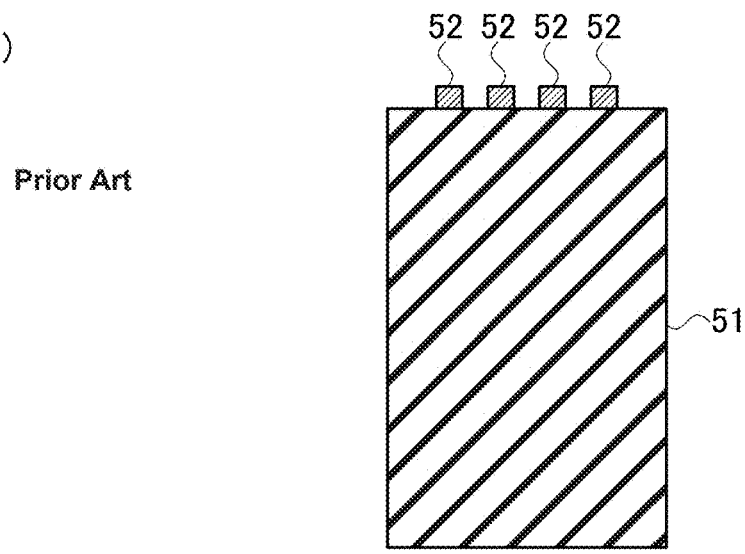
(c) Prior Art
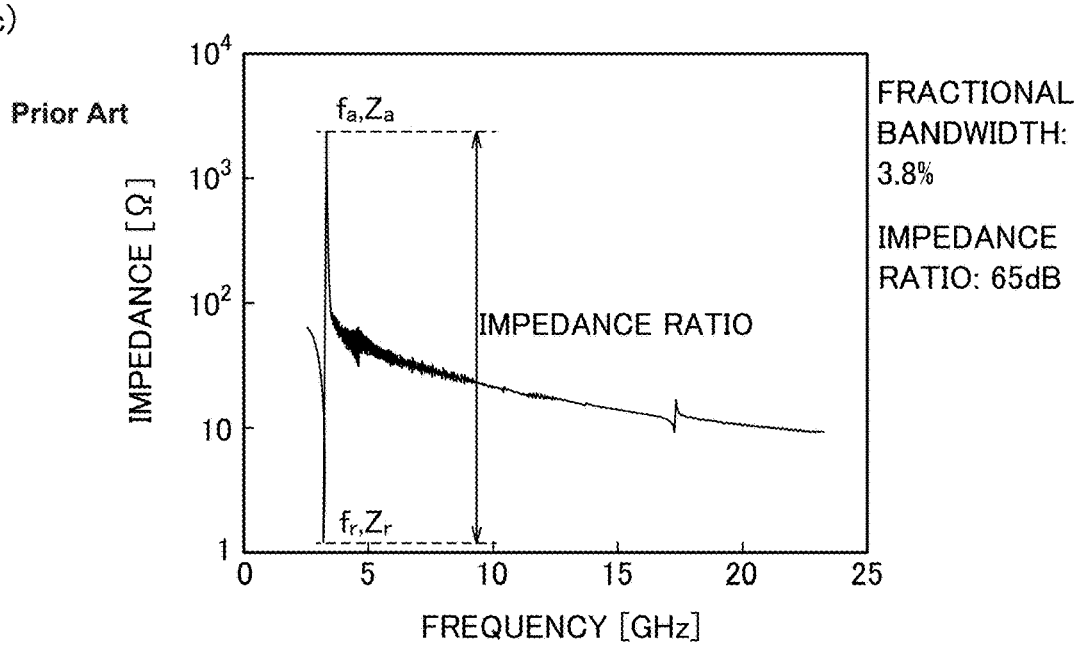

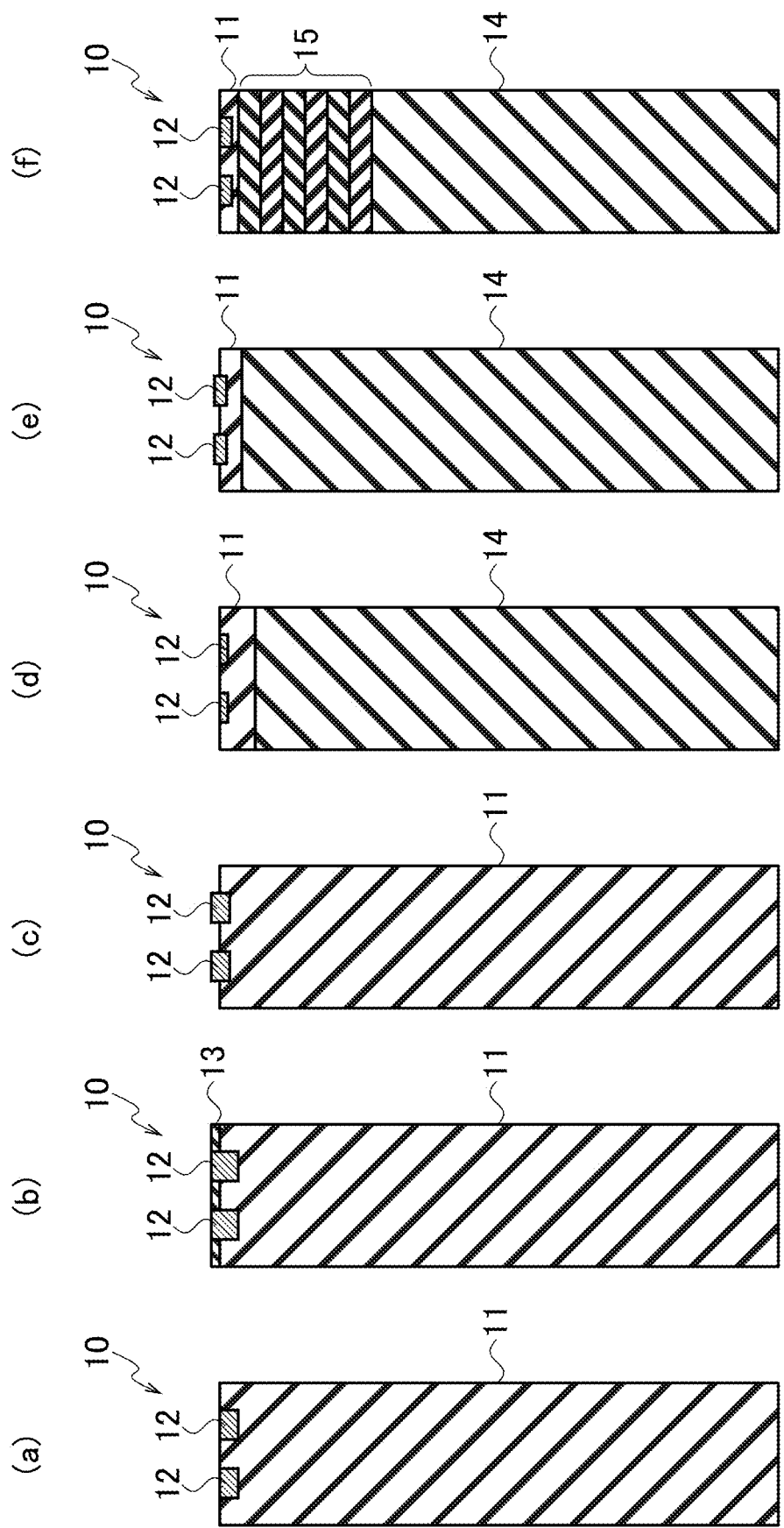

[FIG. 3]
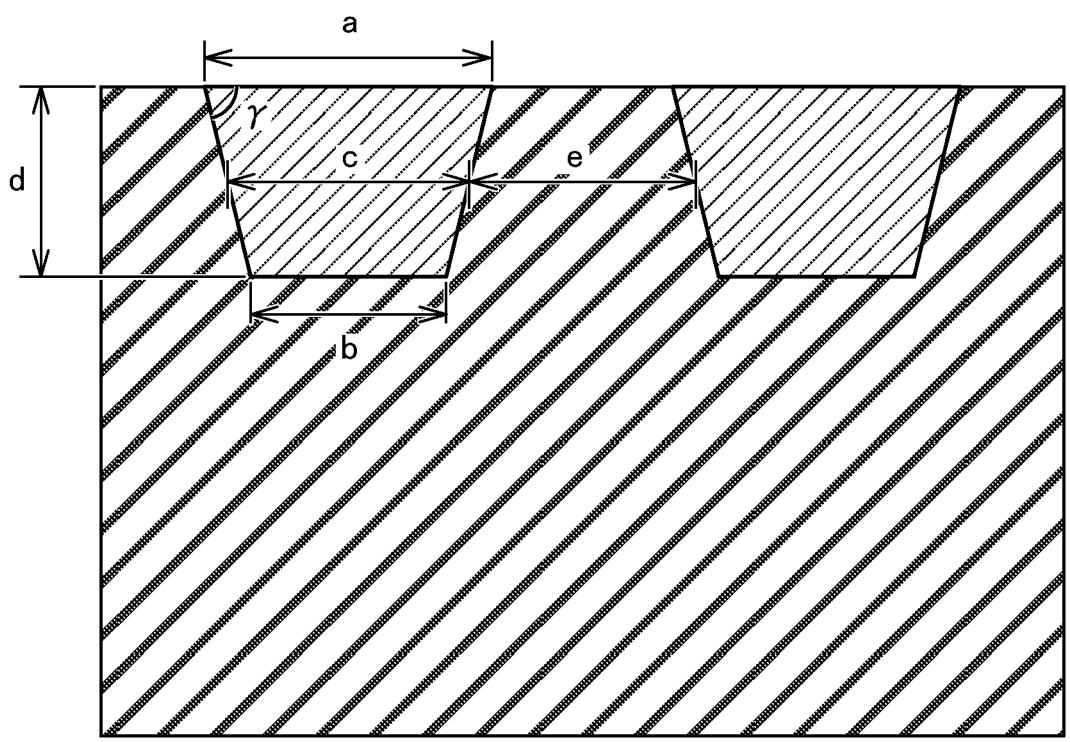

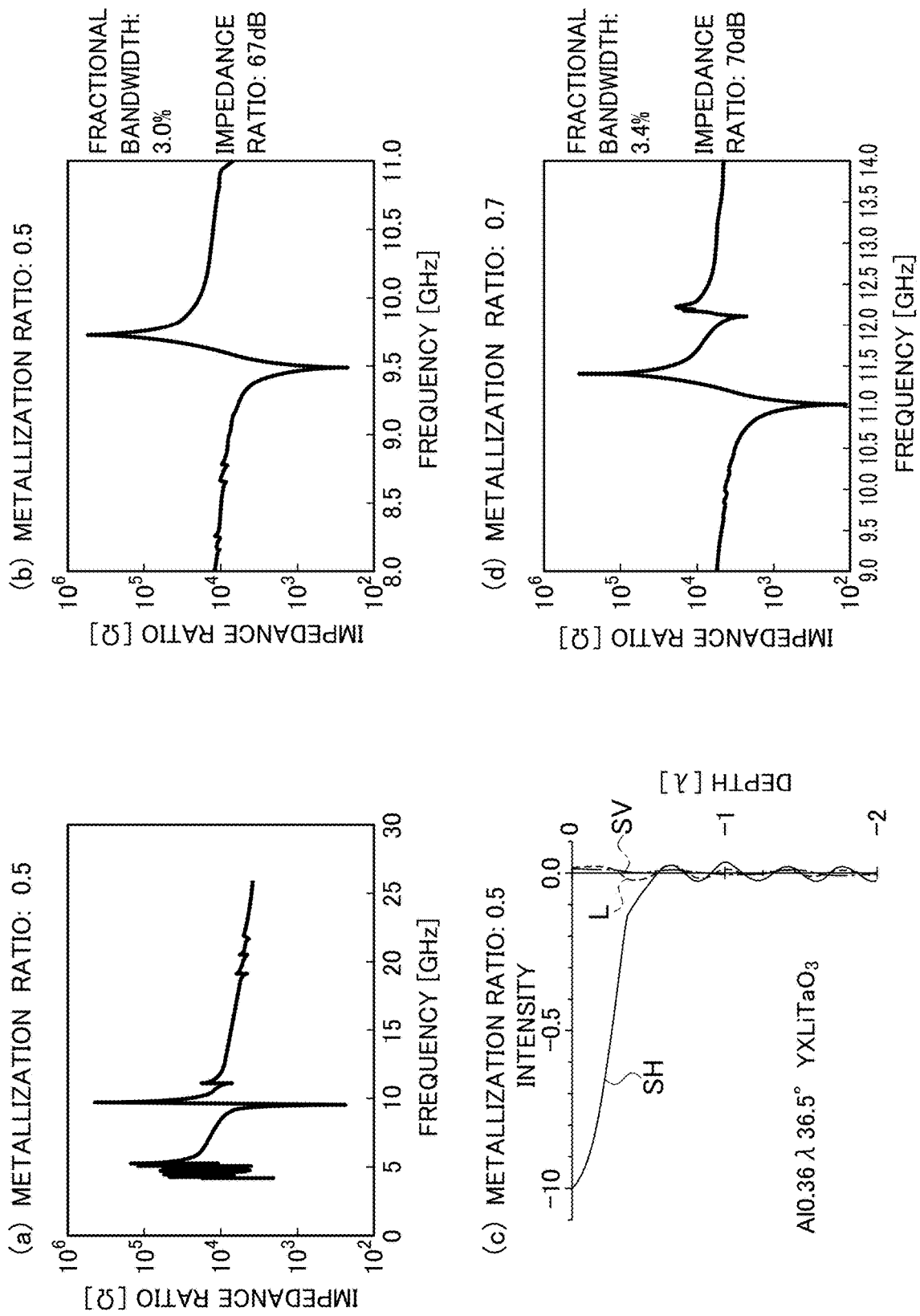

[FIG. 5]
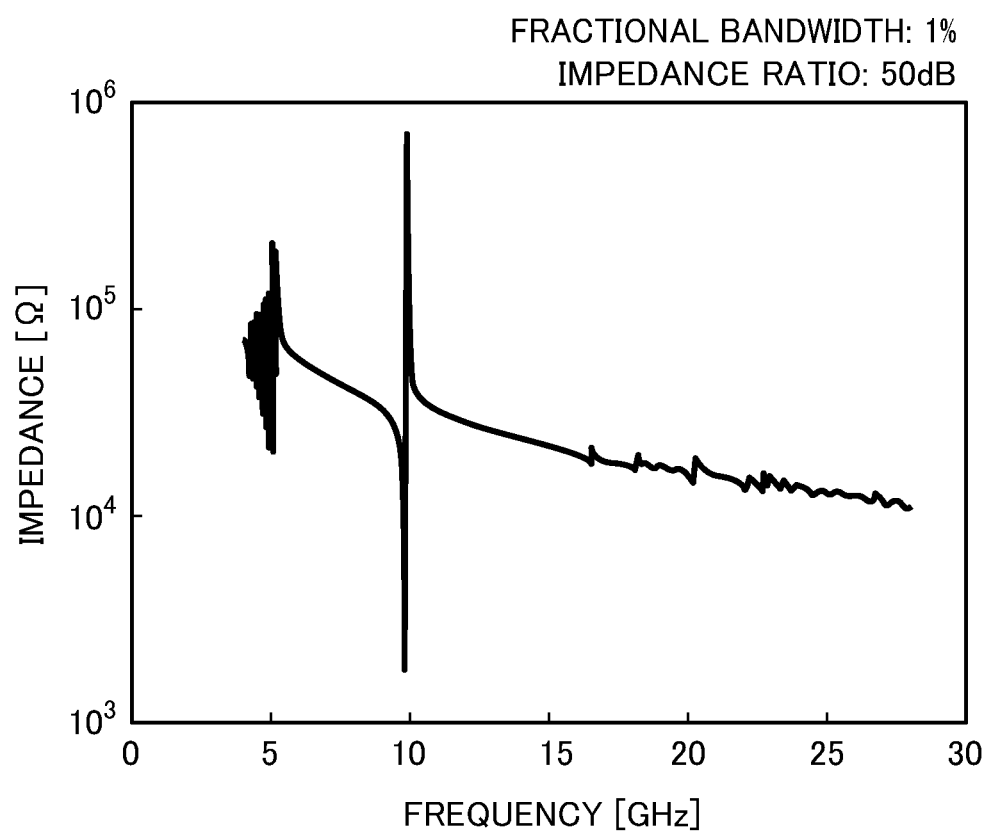

[FIGS. 6(a)-6(b)]
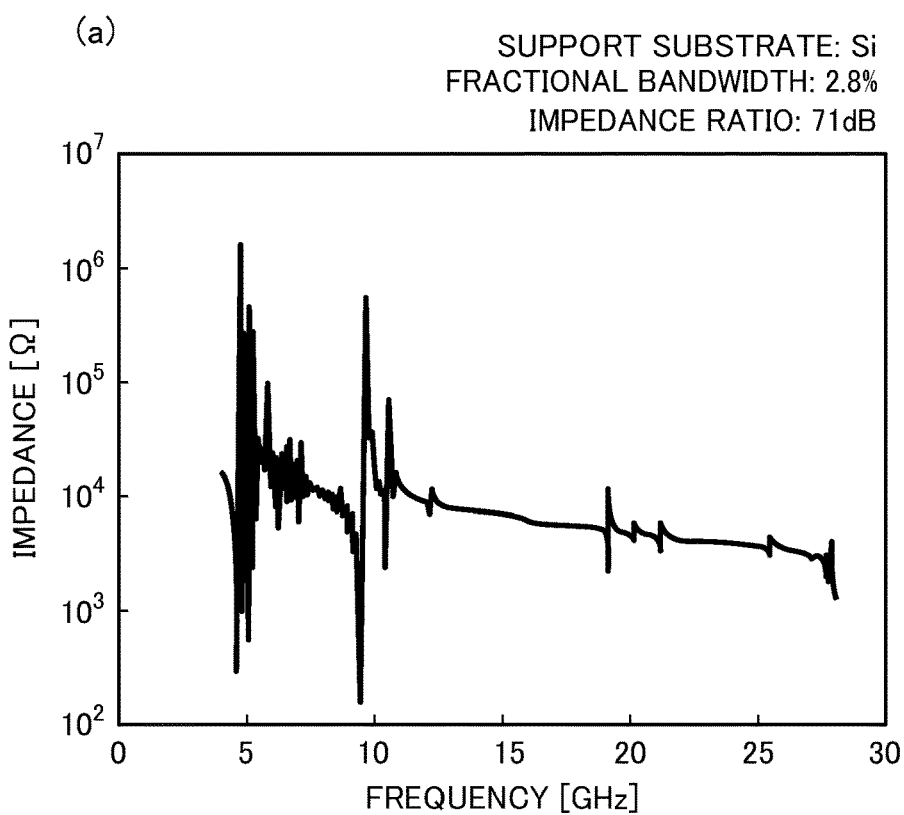
(a) SUPPORT SUBSTRATE: Si
FRACTIONAL BANDWIDTH: 2.8%
IMPEDANCE RATIO: 71dB
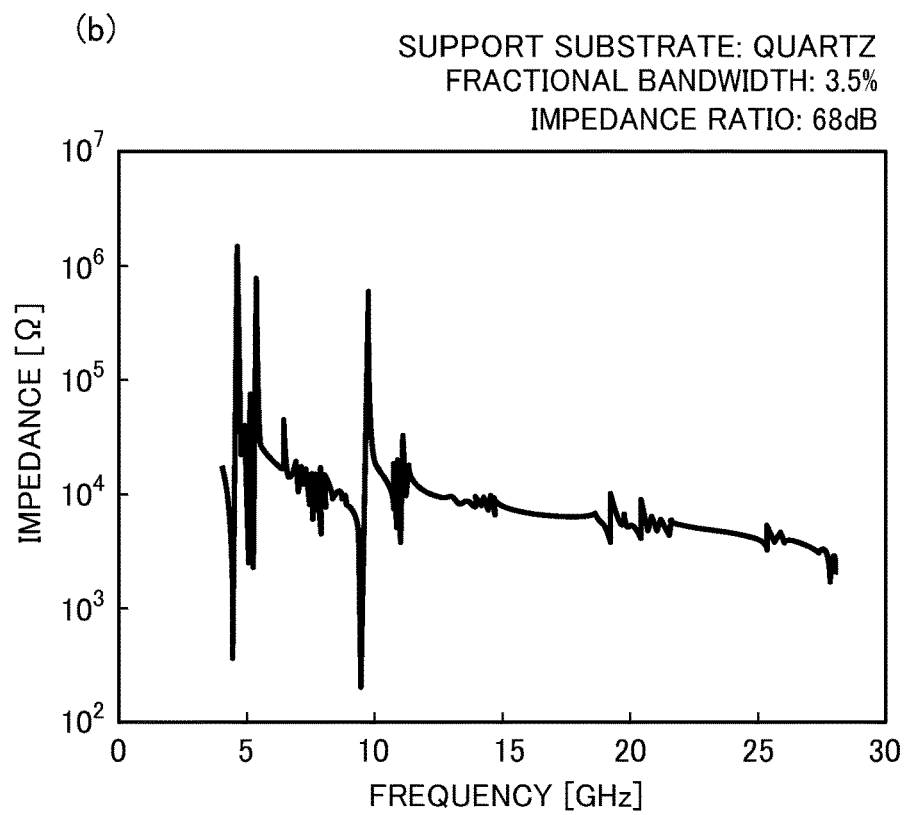
(b) SUPPORT SUBSTRATE: QUARTZ
FRACTIONAL BANDWIDTH: 3.5%
IMPEDANCE RATIO: 68dB

[FIG. 7]
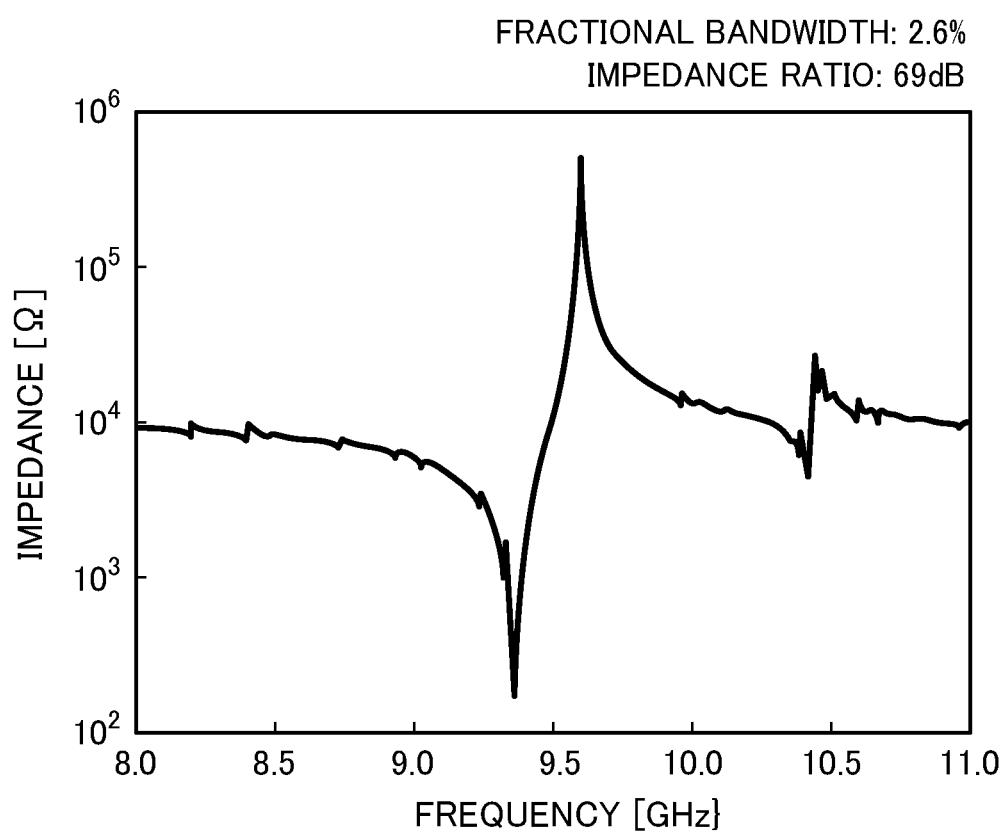

[FIGS. 8(a)-8(b)]
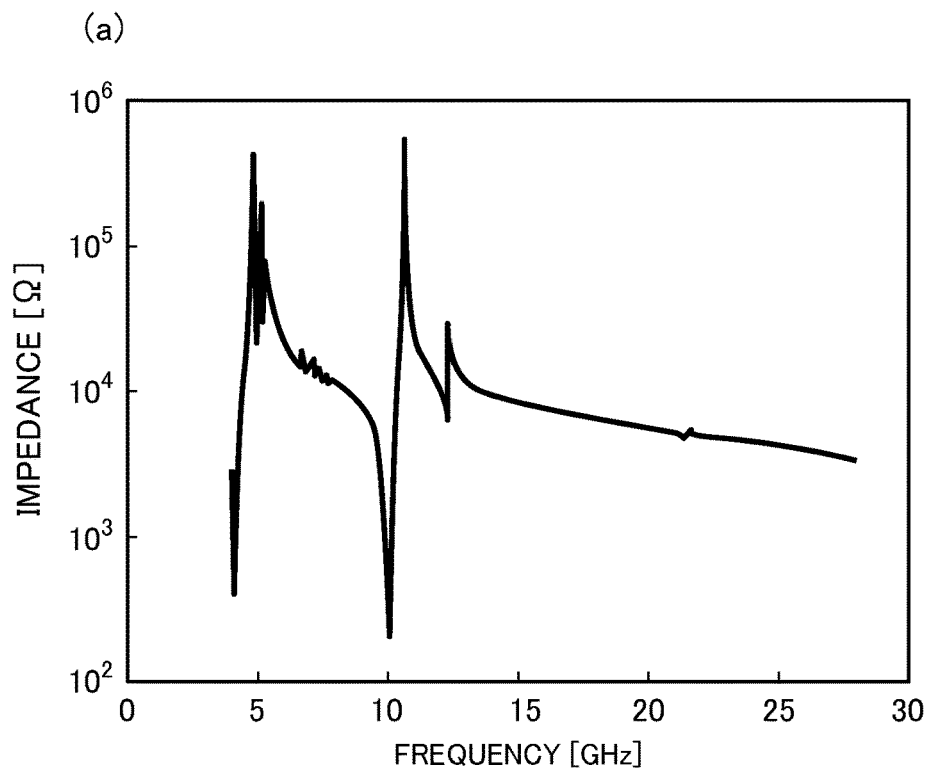
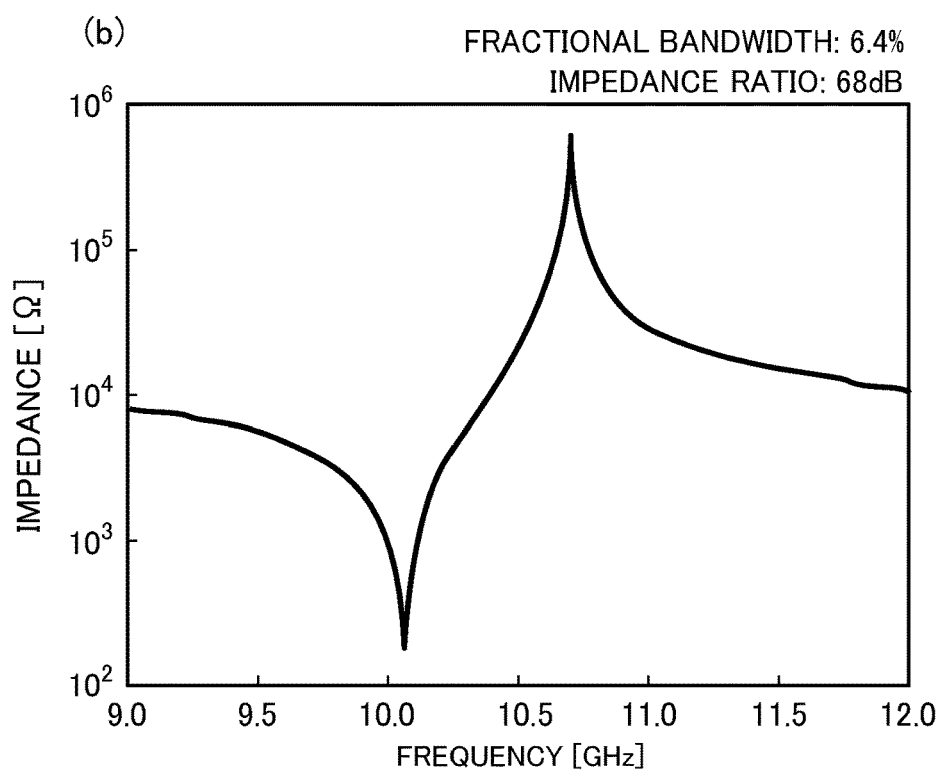

[FIG. 9]
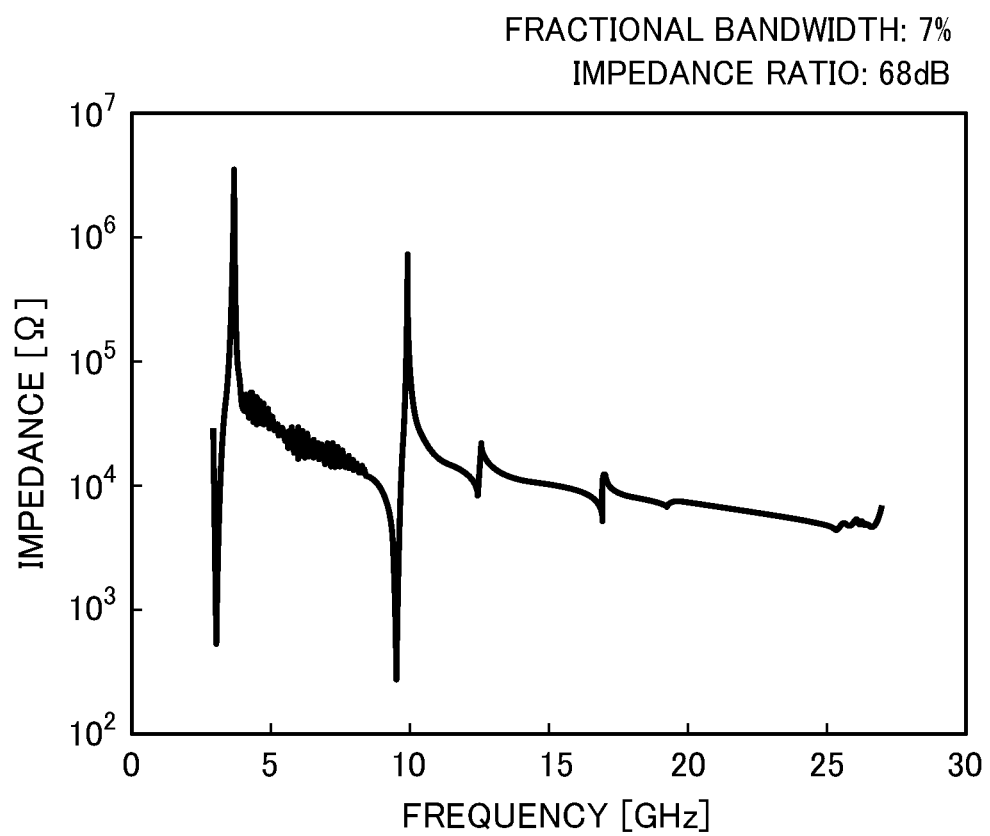

[FIGS. 10(a)-10(b)]
(a)
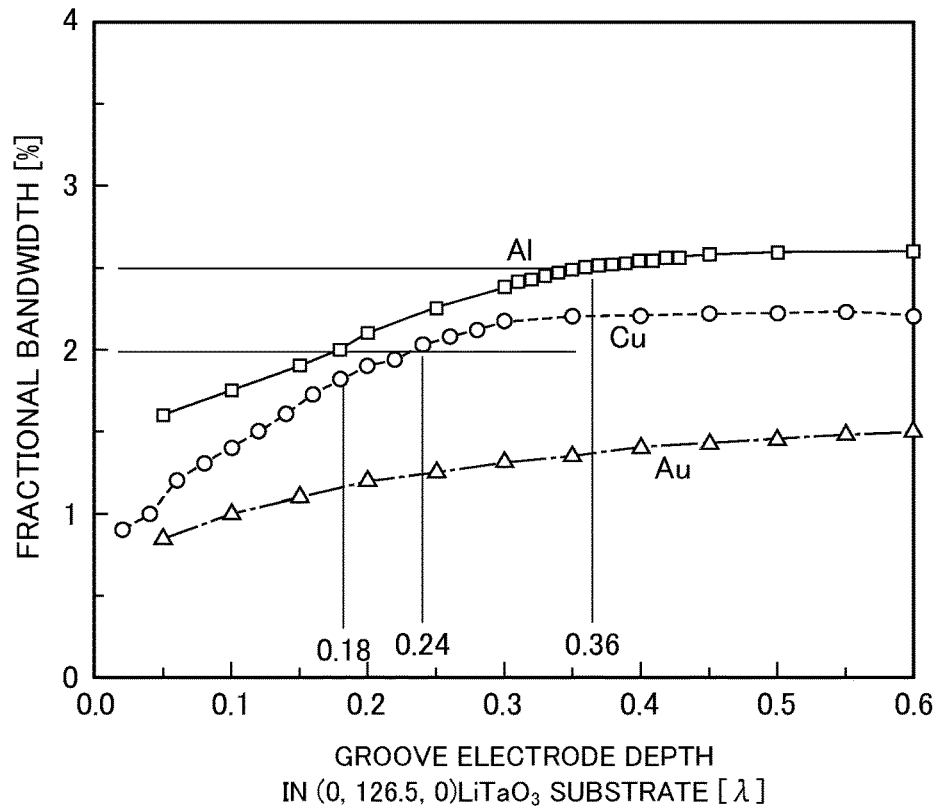
(b)
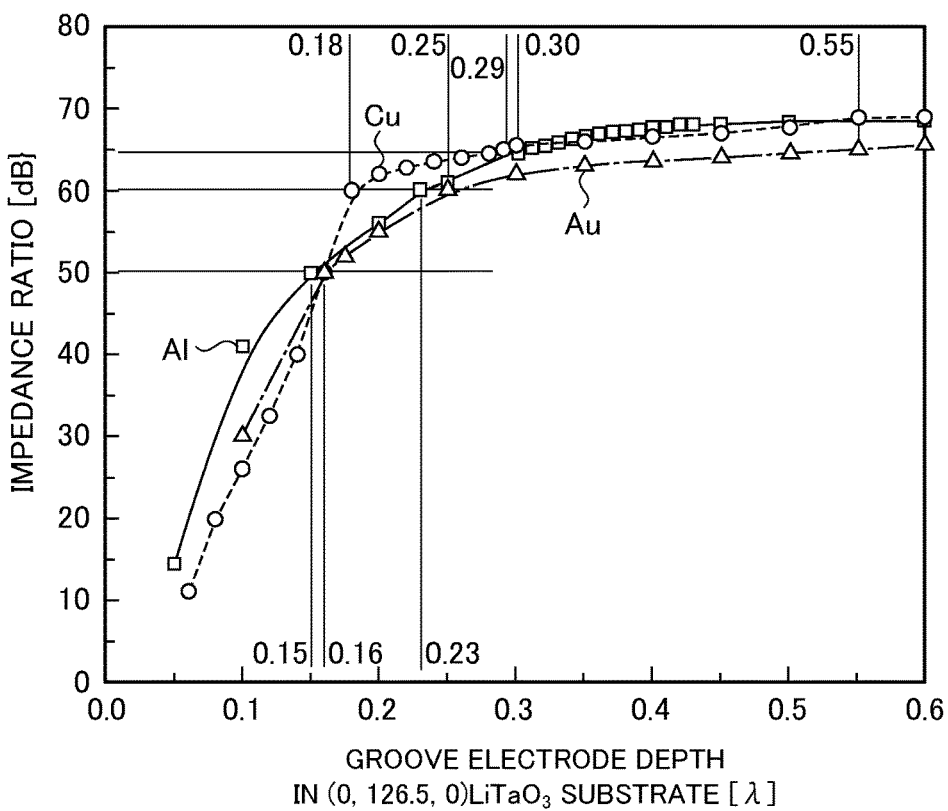

[FIGS. 11(a)-11(b)]
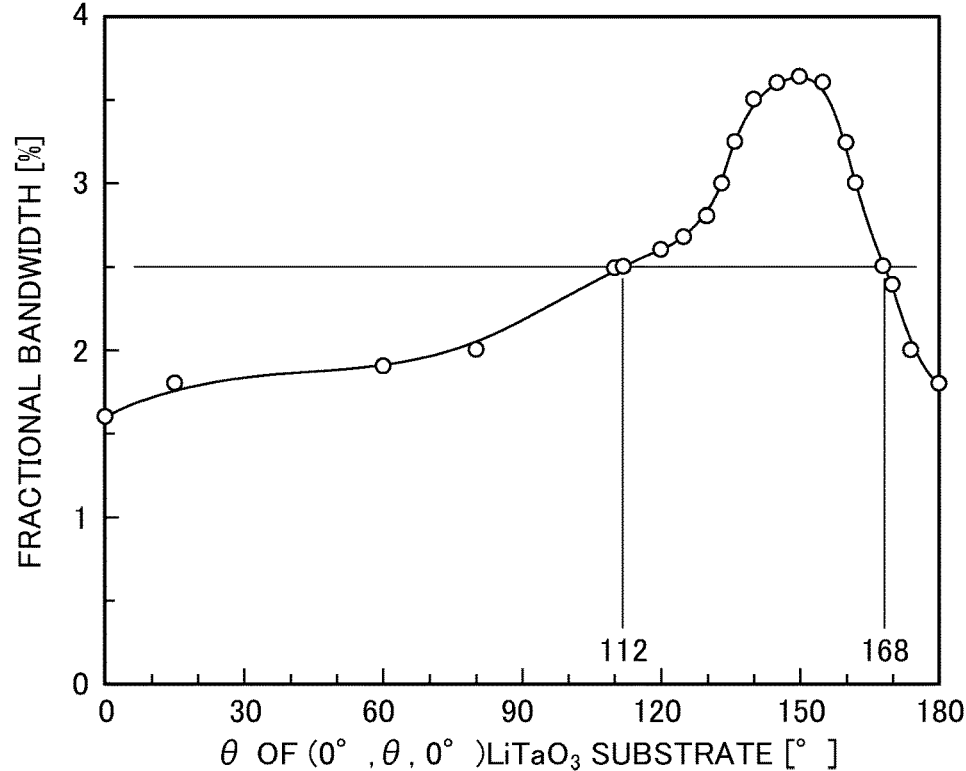
(a)
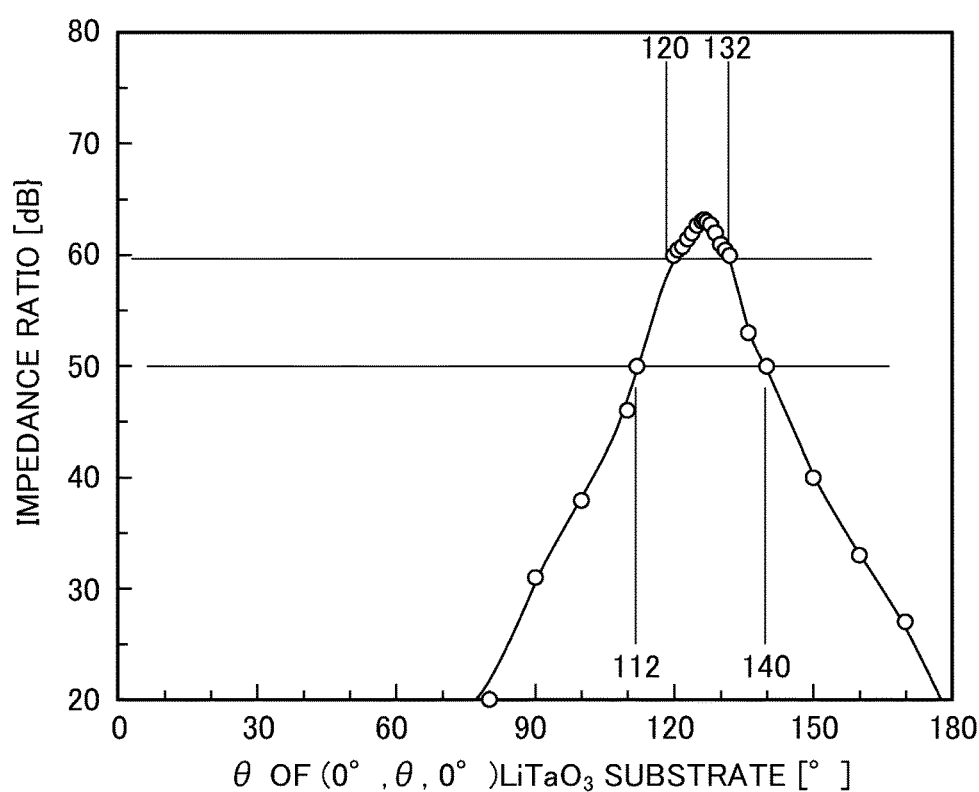
(b)

[FIG. 12]
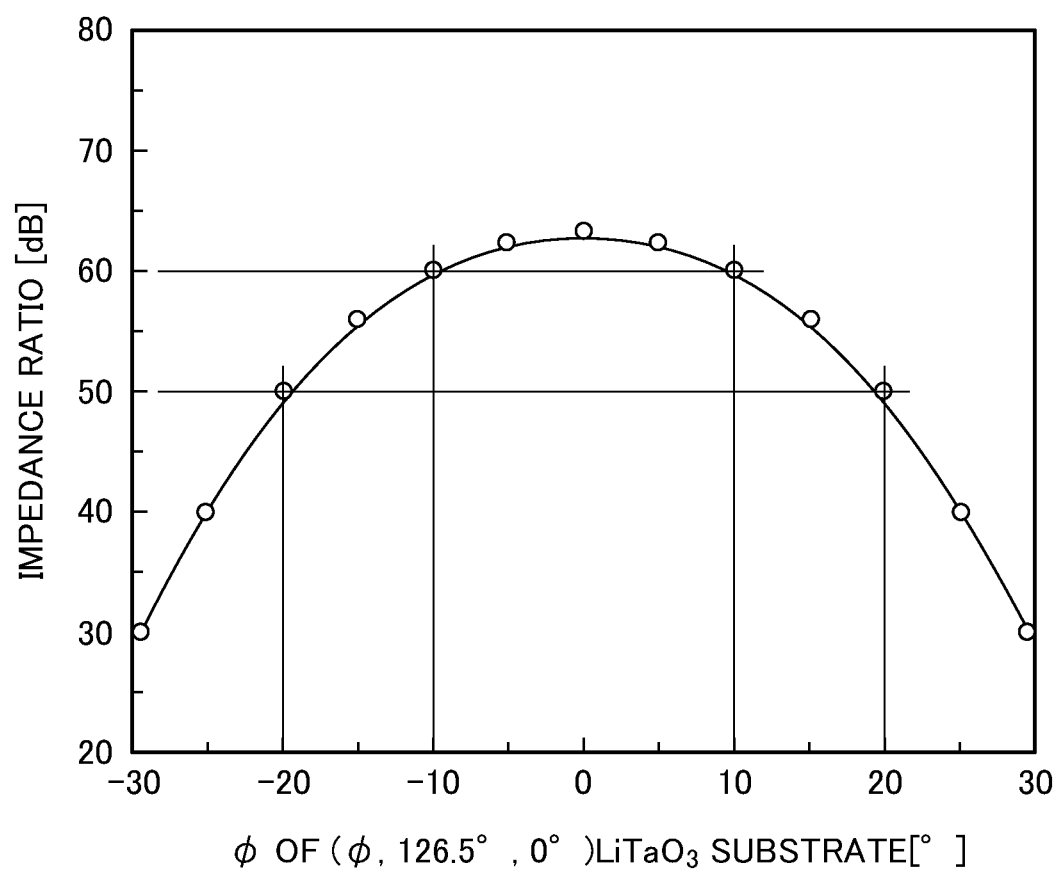

[FIGS. 13(a)-13(b)]
(a)
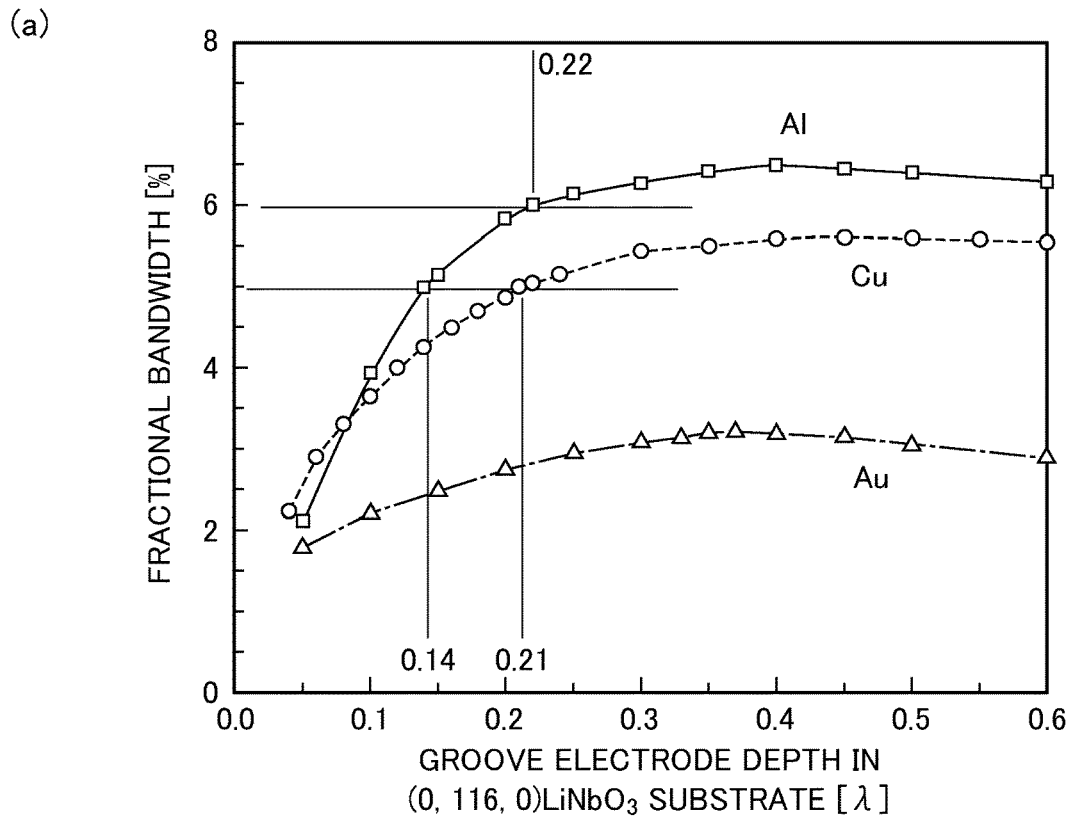
(b)
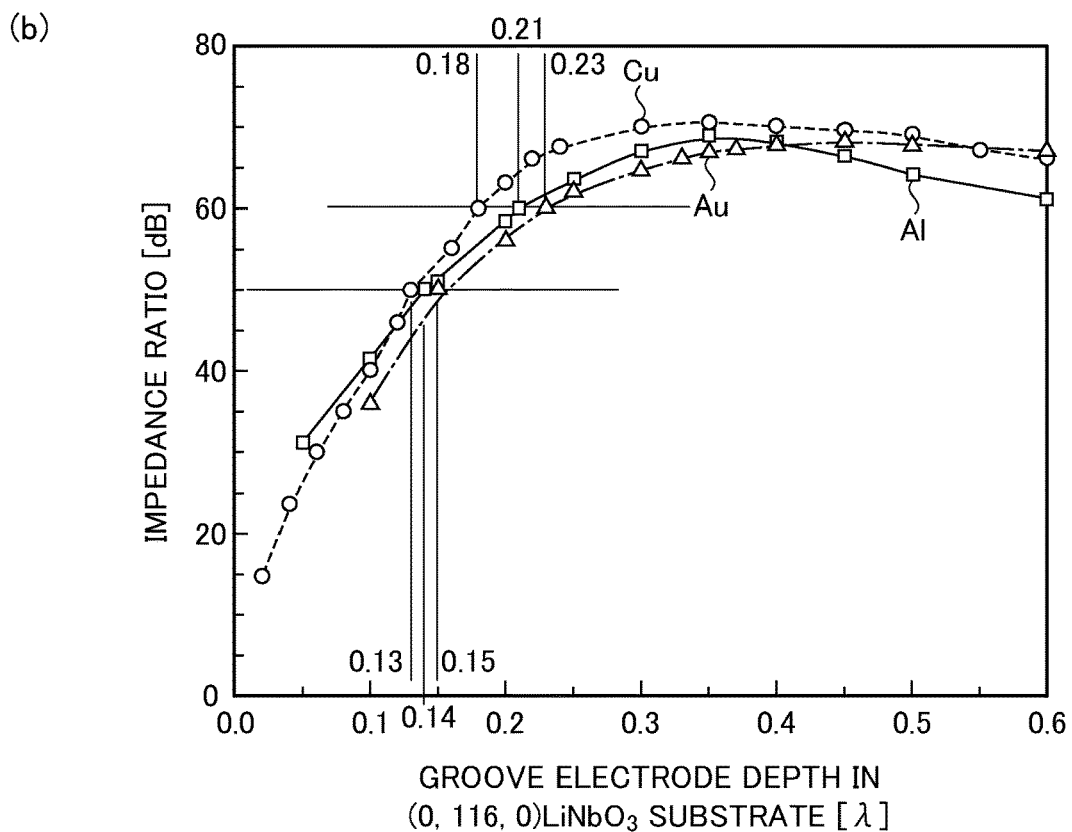

[FIGS. 14(a)-14(b)]
(a)
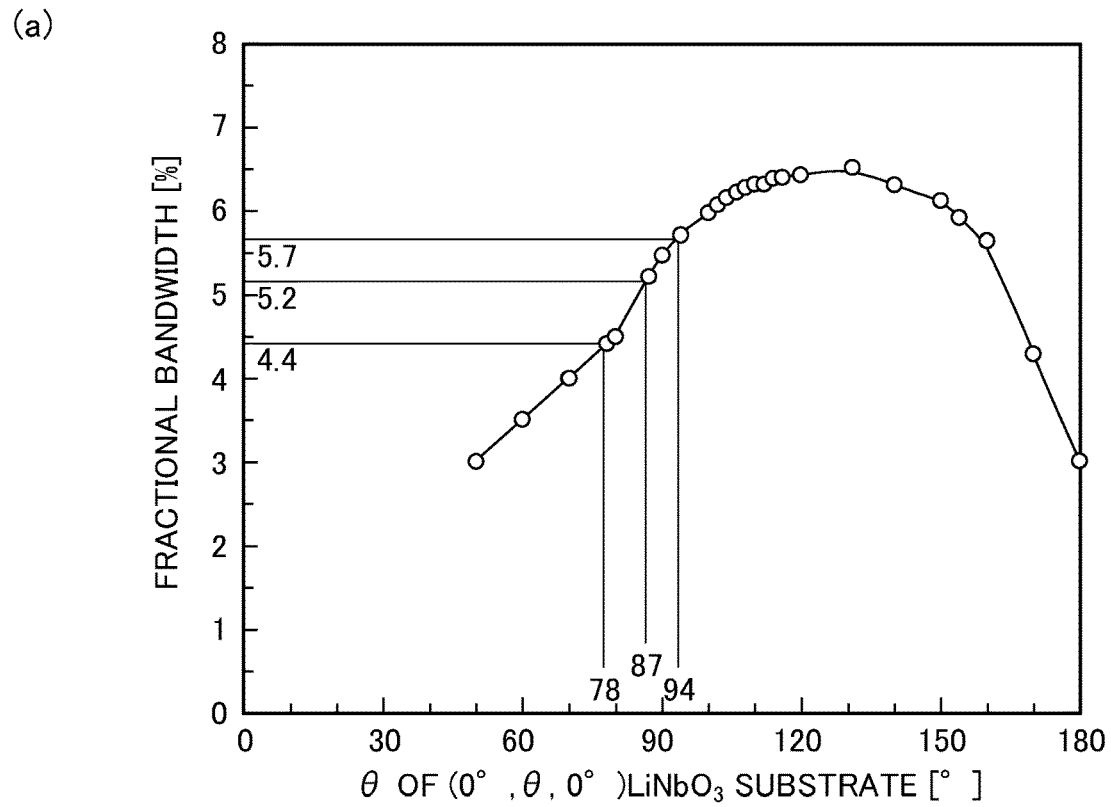
(b)
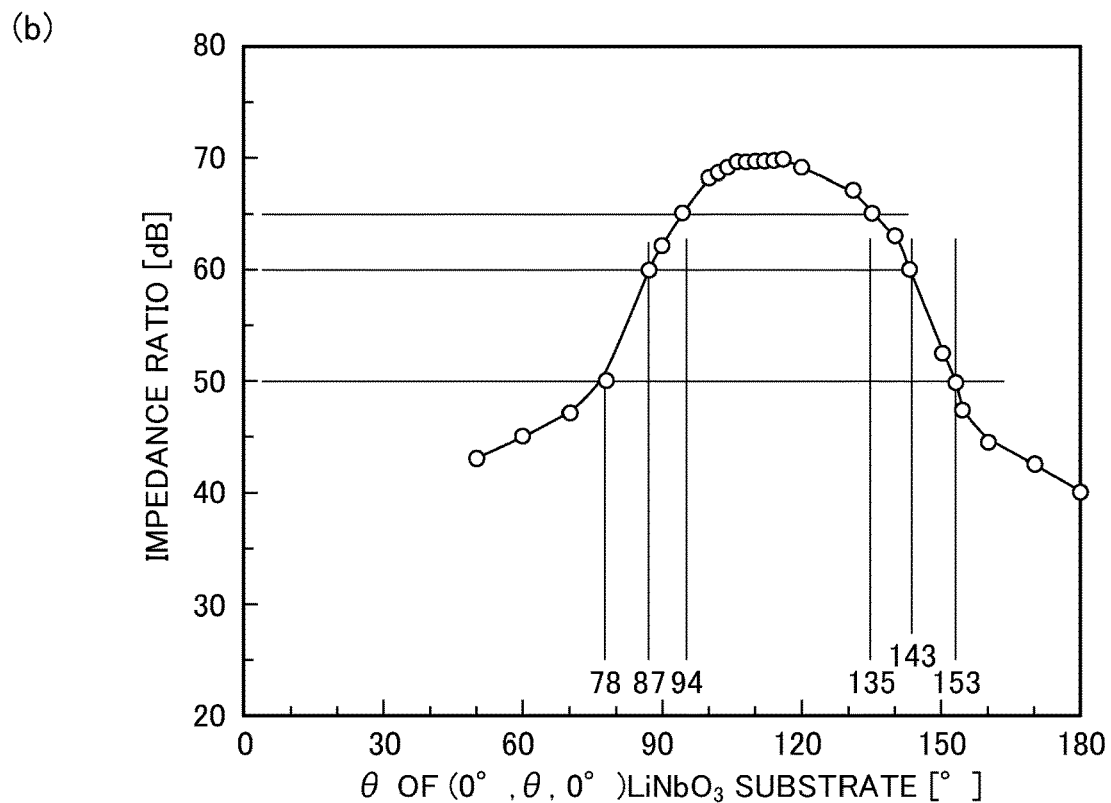

[FIG. 15]
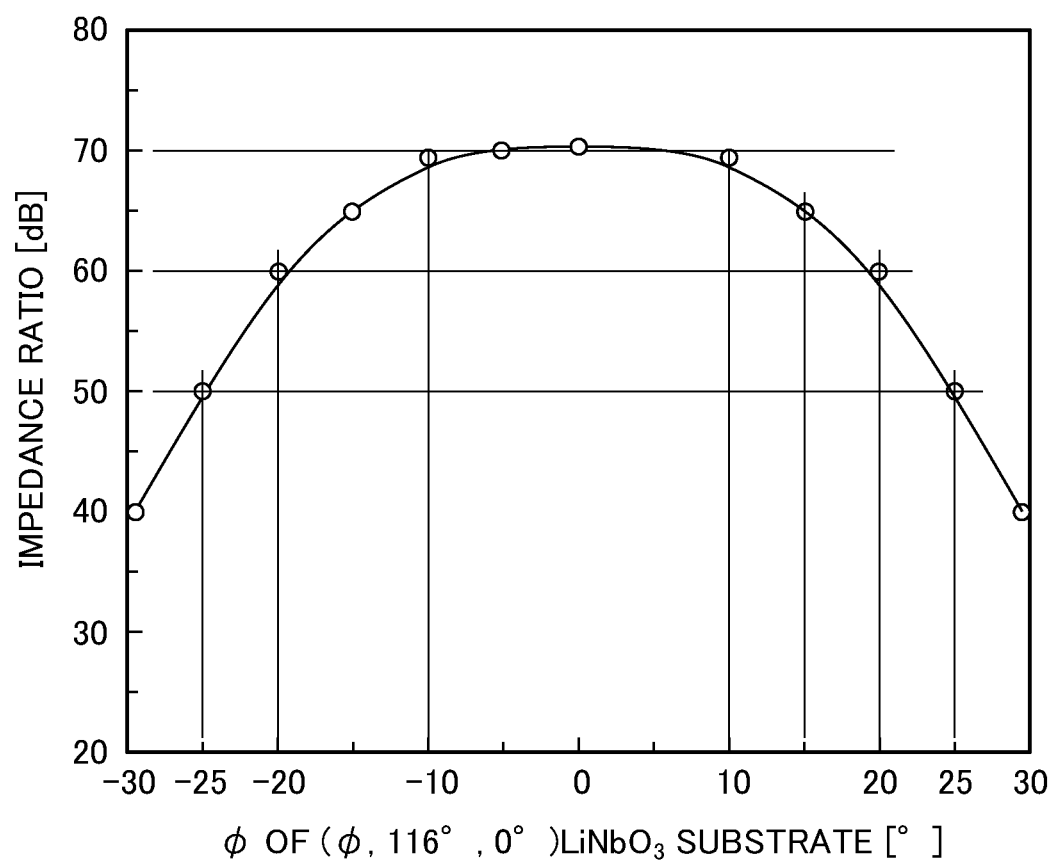

[FIGS. 16(a)-16(b)]
(a)
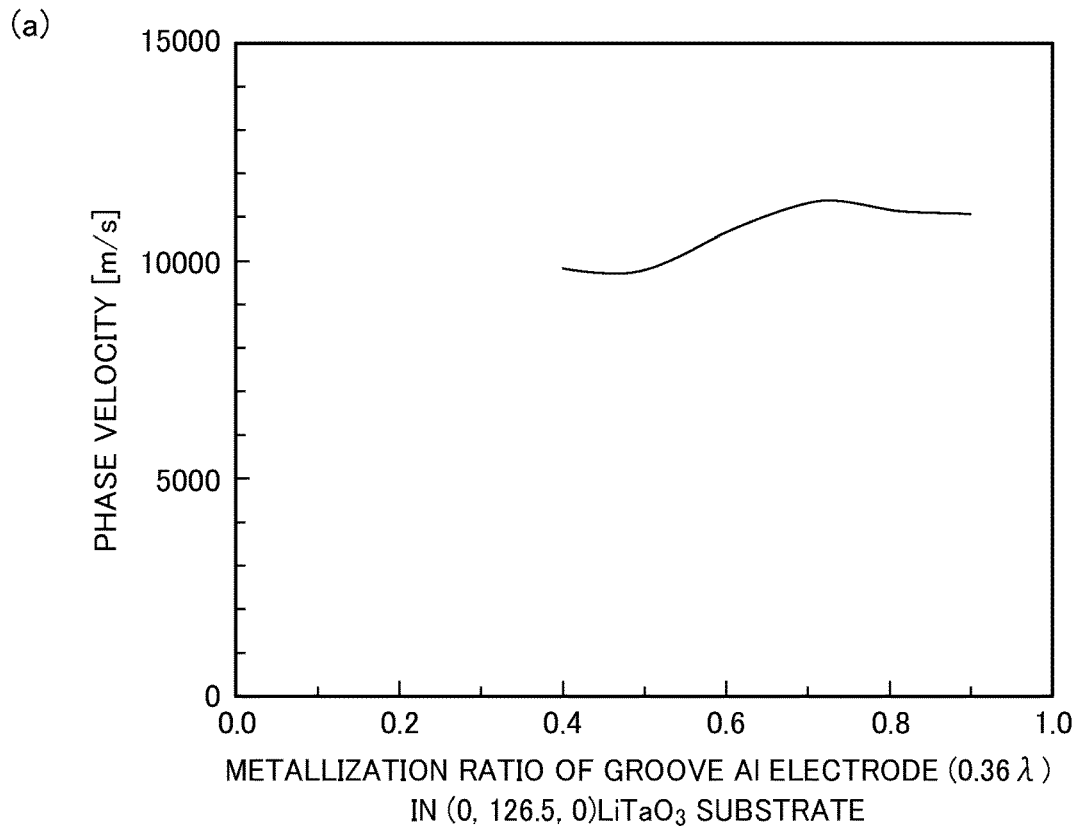
(b)
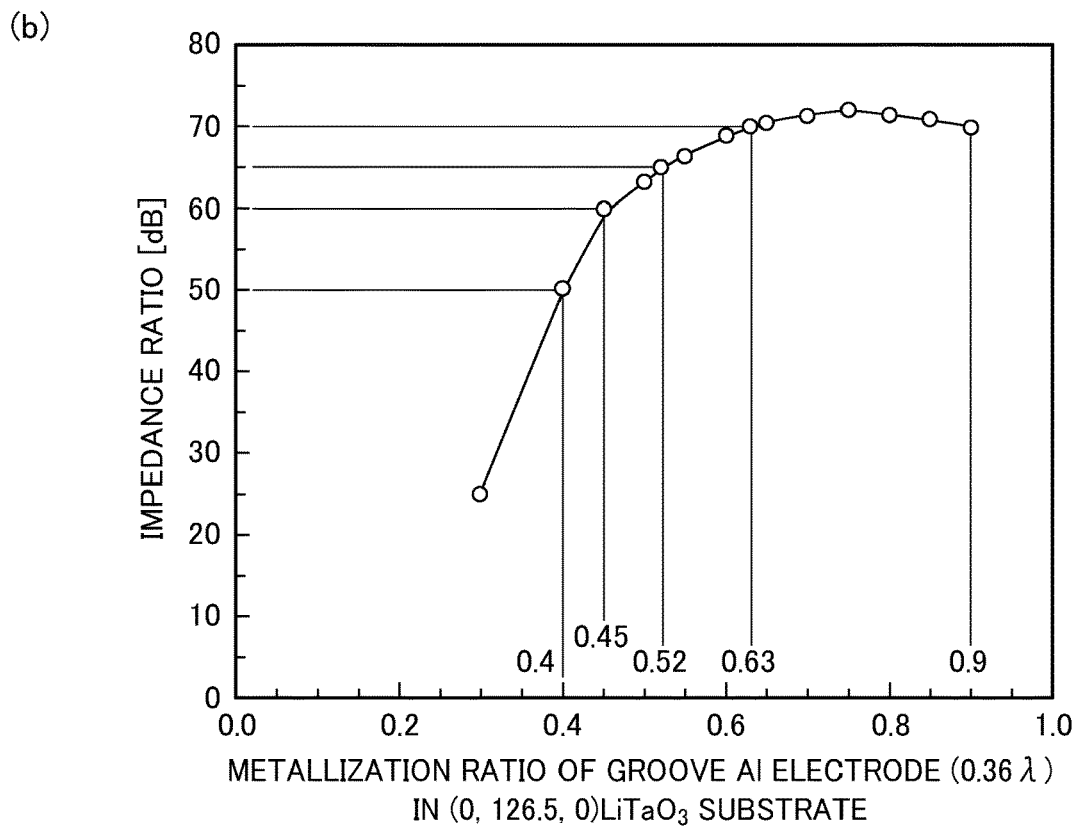

[FIG. 17]
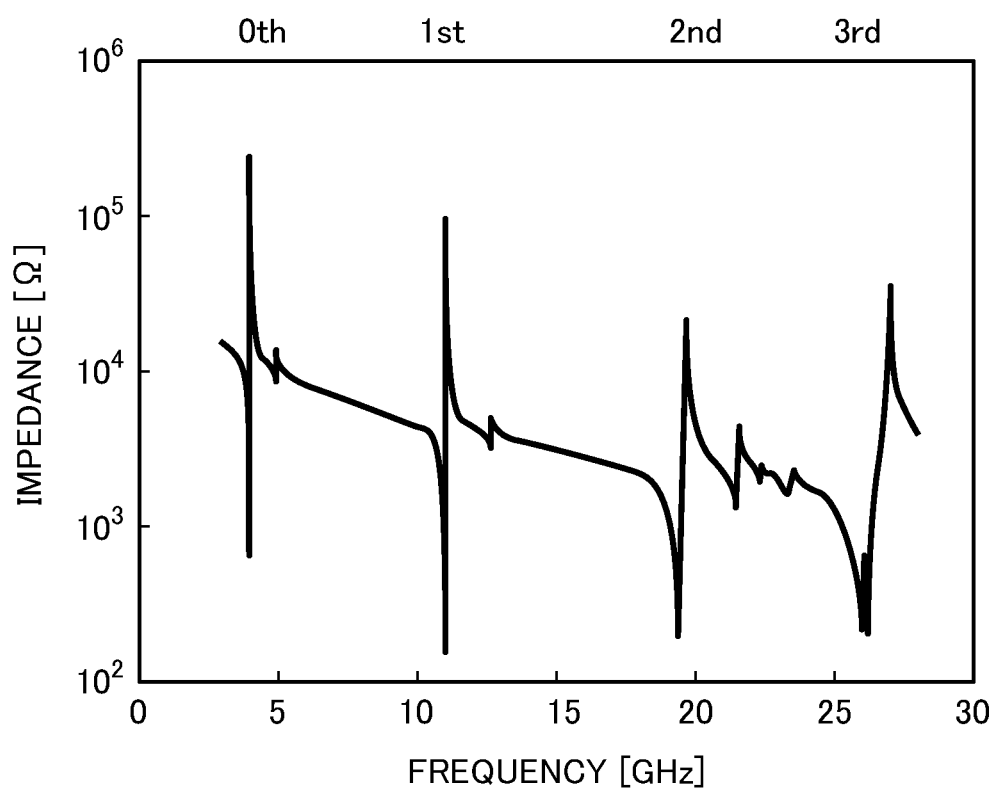

[FIGS. 18(a)-18(b)]
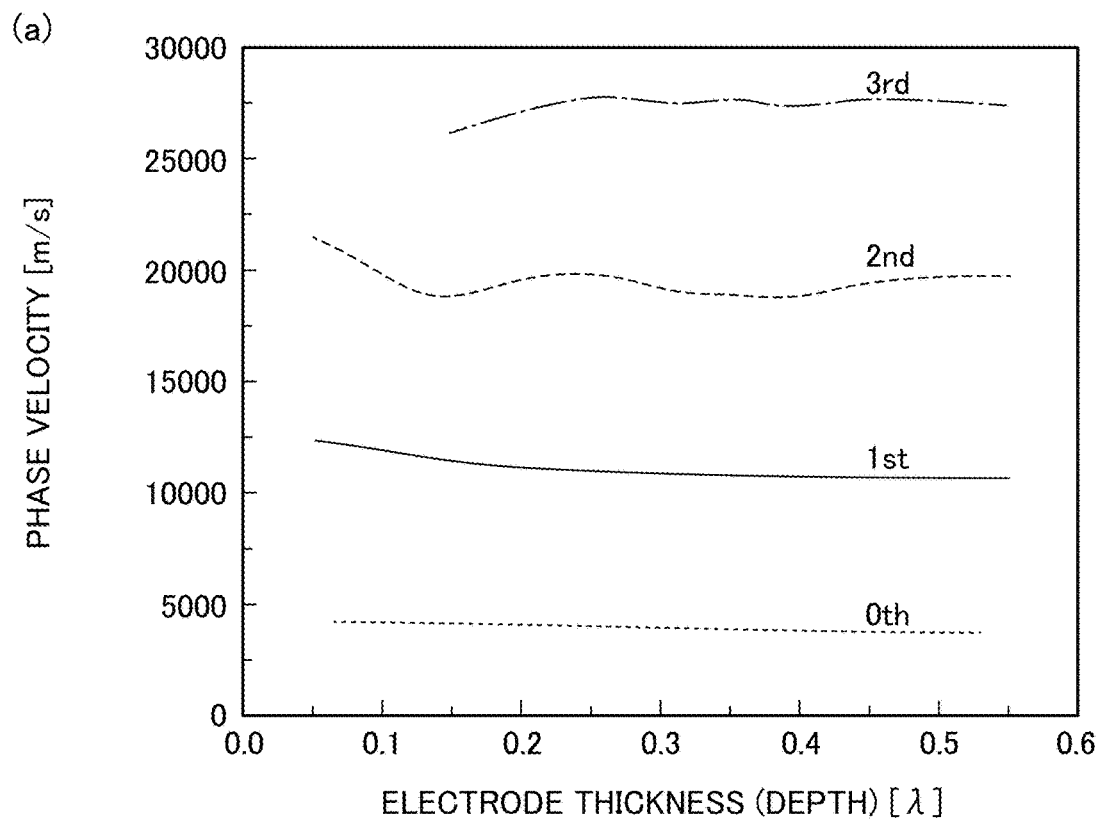
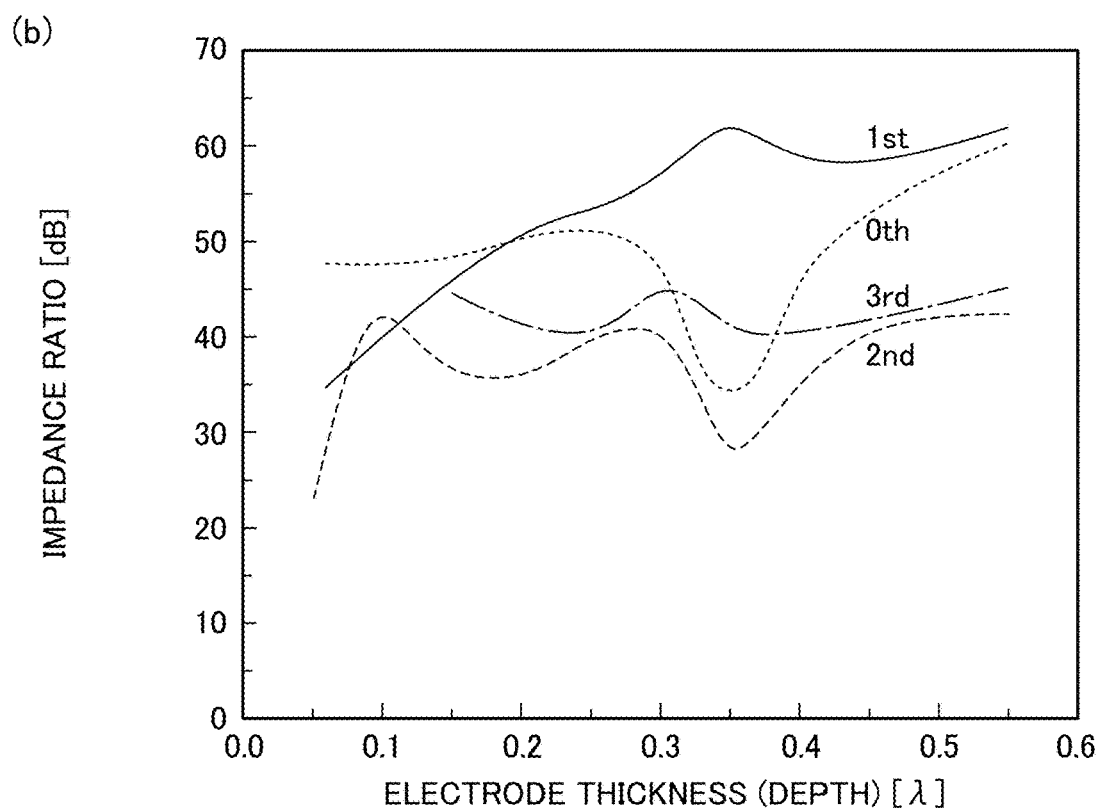

[FIG. 19]
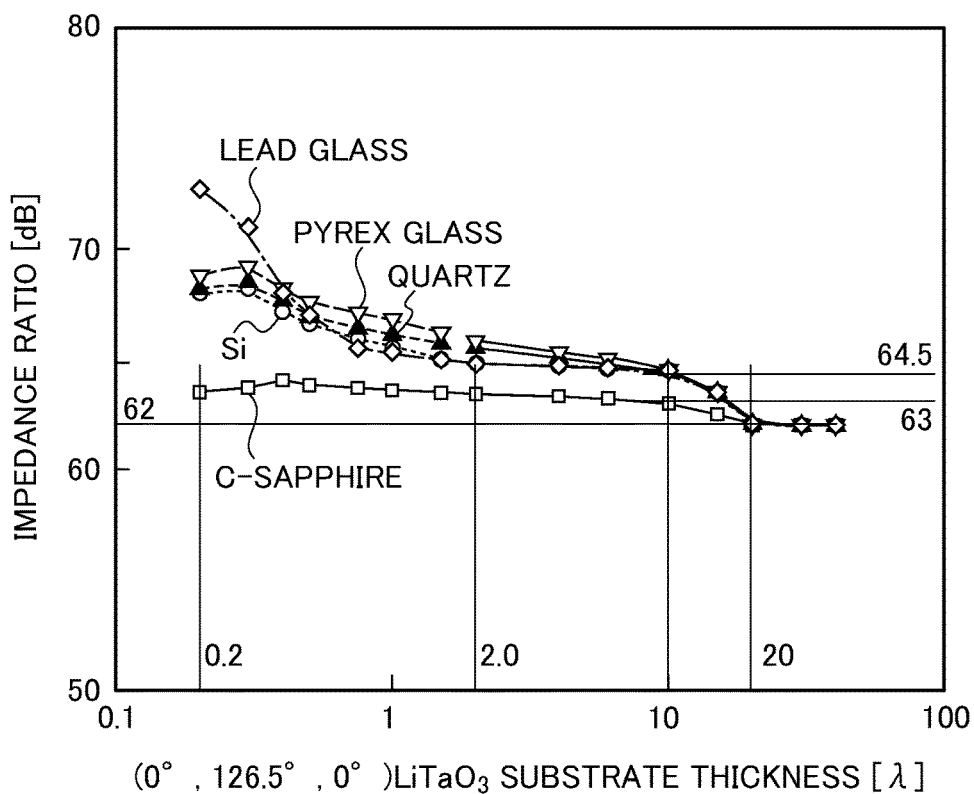
[FIG. 20]
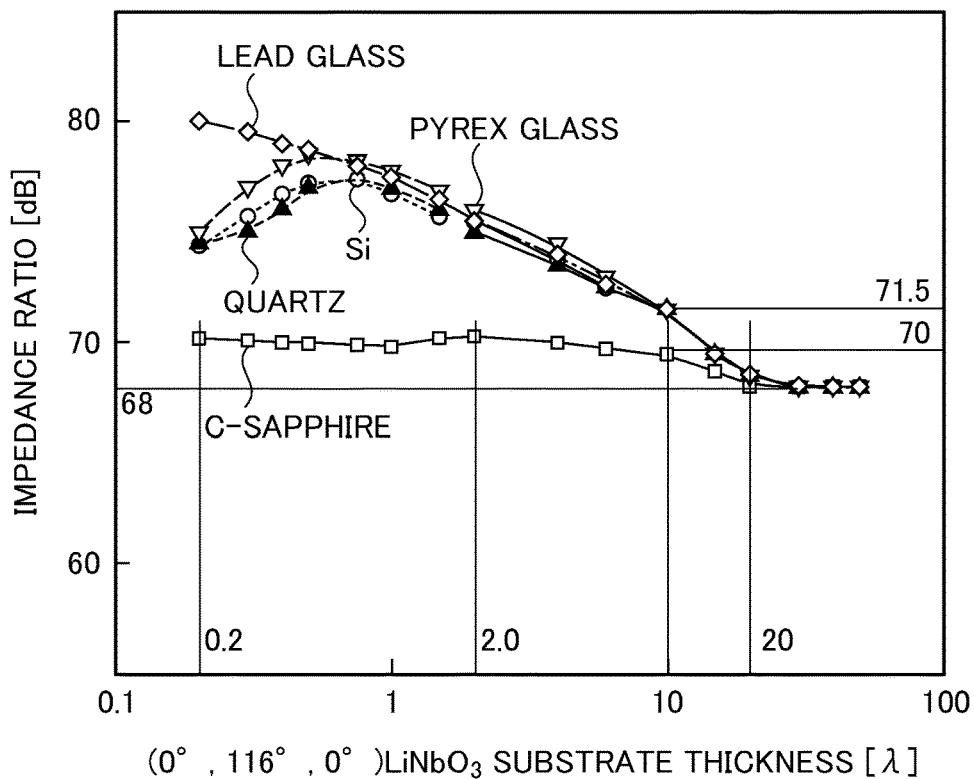

[FIG. 21]
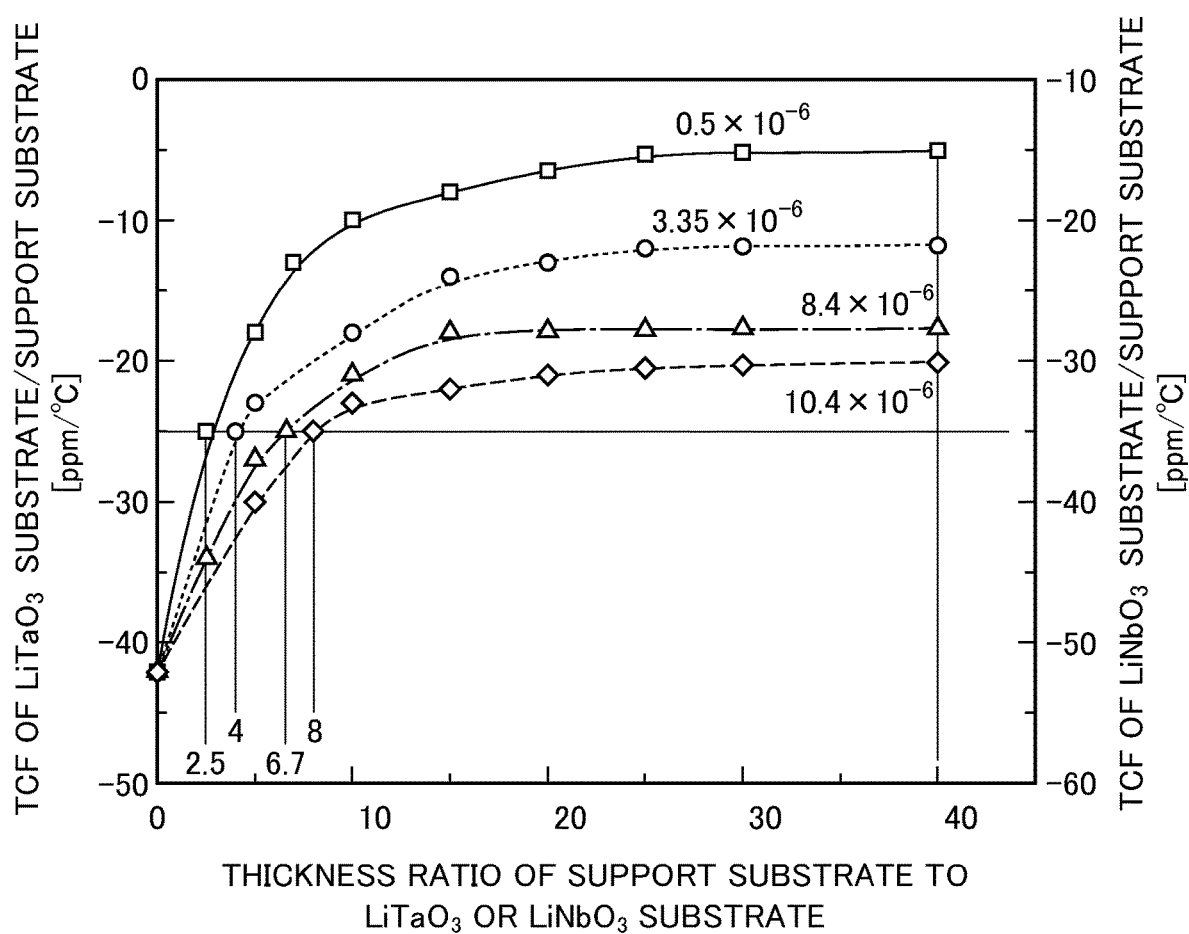

HIGH-ORDER MODE SURFACE ACOUSTIC WAVE DEVICES

TECHNICAL FIELD

The present invention relates to a high-order mode surface acoustic wave device for providing a high-order mode that forms overtones of a fundamental mode.

BACKGROUND ART

In recent years, the frequency band in a range from 700 MHz to 3 GHz mainly used by smartphones and the like includes nearly eighty bands, which are significantly congested. To solve the problem, the fifth generation mobile communication system (5G) for the next generation wireless communication system has been planned to use the frequency band in a range from 3.6 GHz to 4.9 GHz, and a further next generation may be planned to use the frequency band of 6 GHz or greater.

To these plans, typical acoustic wave devices such as surface acoustic wave devices cannot reduce the period (A) of the interdigital transducer (IDT) electrode due to limitations of electric power resistance and manufacturing technologies, and there is a limitation in using higher frequencies. FIGS. 1(a) and 1(b) illustrate a top view and a cross-sectional view respectively of an example of a conventional surface acoustic wave (SAW) device having a structure in which a 42° rotated Y-plate of $LiTaO_3$ crystal is used for a piezoelectric substrate and an X-propagation interdigital transducer electrode 52 is formed from Al. The cross-sectional view of FIG. 1(b) illustrates a cross section taken along the cutting-line I-I in the top view of FIG. 1(a).

FIG. 1(c) illustrates impedance-frequency characteristics obtained when the interdigital transducer electrode 52 has a period of 1.2 μm. The resonance frequency was about 3.2 GHz, the fractional bandwidth was 3.8%, and the impedance ratio was 65 dB. In addition, although a small response appears to be caused by a high-order mode at 17.2 GHz, this response is not at a practical level. Even if the period of the interdigital transducer electrode 52 is reduced to 1 μm, the resonance frequency is about 3.8 GHz, and thus the conventional SAW device obviously cannot cover the frequency band required for 5G or later generation mobile communication systems.

Here, Patent Literature (PTL) 1 discloses a surface acoustic wave device including an electrode of Pt, Cu, Mo, Ni, Ta, W or the like, which is heavier than Al, at a metallization ratio of 0.45 or less, where the electrode is embedded in a $LiNbO_3$ substrate of Euler angles (0°, 80°-130°, 0°) to excite a fundamental mode of Love waves, thereby obtaining a wide bandwidth. Non-Patent Literature (NPL) 1 also discloses a surface acoustic wave device including a Cu electrode of 0.1 wavelength or less, where the Cu electrode is embedded in a 42° rotated Y-plate $LiTaO_3$ substrate and an Al electrode is formed on the Cu electrode to obtain a higher Q factor when excited in the fundamental mode. On the other hand, film bulk acoustic resonators (FBARs) using a piezoelectric film of AlN or ScAlN have been researched as acoustic wave filters for the frequency band of 1.9 GHz (for example, see Non-Patent Literature (NPL) 2).

CITATION LIST

Patent Literature

[PTL 1] International Publication No. WO 2014/054580A1

Non Patent Literature

[NPL 1] T. Kimura, M. Kadota, and Y. IDA, "High Q SAW resonator using upper-electrodes on Grooved-electrode in $LiTaO_3$", Proc. IEEE Microwave Symp. (IMS), p. 1740, 2010.

[NPL 2] Keiichi Umeda et al., "PIEZOELECTRIC PROPERTIES OF ScAlN THIN FILMS FOR PIRZO-MEMS DEVICES", MEMS 2013, Taipei, Taiwan Jan. 20-24, 2013

SUMMARY OF INVENTION

Technical Problem

However, according to the technologies disclosed in PTL 1 and NPL 1, the metal used in the electrodes is heavier and the metallization ratio is smaller and thus the performance has been not sufficient in frequency bands of 3.6 GHz or higher. According to the bulk acoustic wave device of NPL 2, due to the piezoelectric film formed from a polycrystalline film, the impedance ratio as small as 55 dB is obtained at 1.9 GHz and the attenuation becomes greater at a superhigh frequency, and thereby a satisfying property has been difficult to realize. Further, the frequencies of FBARs are determined solely by an amount of (the sound velocity of the film)/(2× (the thickness of the film)), and thus the film needs to have an extremely smaller thickness for obtaining higher frequencies. The conventional FBARs include a self-supported piezoelectric film and its mechanical strength cannot be maintained for a superhigh frequency application that may require an extremely thinned film.

In view of the aforementioned problem, the object of the present invention is to provide a high-order mode surface acoustic wave device that may achieve good characteristics as well as a sufficient mechanical strength even in a higher frequency band including 3.8 GHz or greater.

Solution to Problem

To achieve this object, the high-order mode surface acoustic wave device according to the present invention may include a piezoelectric substrate including $LiTaO_3$ or $LiNbO_3$ crystal and an interdigital transducer electrode embedded in a surface of the piezoelectric substrate to use a surface acoustic wave in a high-order mode.

The high-order mode surface acoustic wave device may include the interdigital transducer electrode embedded in the surface of the piezoelectric substrate to excite a high-order mode (such as first-order mode, second-order mode, third-order mode, or the like) of the surface acoustic wave such that a high-order mode enabling a greater impedance ratio can be obtained. The high-order mode surface acoustic wave device may use the high-order mode to handle a high frequency band and achieve good characteristics even in a high frequency band of 3.8 GHz or greater. Further, using a high-order mode may eliminate the need to super thin the piezoelectric substrate or reduce the period of the interdigital transducer electrode even in a high frequency band of 3.8 GHz or greater such that a sufficient mechanical strength can be maintained. It is to be understood that the piezoelectric substrate may include a piezoelectric film or a piezoelectric thin plate.

The high-order mode surface acoustic wave device may have the interdigital transducer electrode formed to protrude from the surface of the piezoelectric substrate. Even in this case, a high-order mode enabling a greater impedance ratio can be obtained.

The high-order mode surface acoustic wave device may include a film or substrate provided in contact with the piezoelectric substrate. Further, the high-order mode surface acoustic wave device may include a support substrate and/or multi-layer film provided in contact with a surface opposite to the surface of the piezoelectric substrate on which the interdigital transducer electrode is provided. When the support substrate is included, the support substrate may be formed from a material other than metal. Further, the support substrate may be formed from at least one of Si, quartz, sapphire, glass, silica, germanium and alumina. Still further, when the multi-layer film is included, the multi-layer film may be formed from an acoustic multi-layer film into which a plurality of layers having different acoustic impedances are stacked. Also in these cases, a high-order mode enabling a greater impedance ratio can be obtained.

Such a high-order mode surface acoustic wave device may include an interdigital transducer electrode having a metallization ratio in a range preferably from 0.4 or greater to 0.9 or less, and more preferably from 0.63 or greater. In this case, a high-order mode enabling a greater impedance ratio can be obtained. In addition, the bandwidth can be expanded.

Further, to achieve a high-order mode enabling a greater impedance ratio, the high-order mode surface acoustic wave device may be configured as below: the piezoelectric substrate may be formed from $LiTaO_3$ crystal and the interdigital transducer electrode may be formed from at least one of Ti, Al and Mg alloys. In this case, the interdigital transducer electrode is embedded in the piezoelectric substrate from the surface thereof preferably to a depth with the wavelength of surface acoustic wave/the metallization ratio to be in a range from 0.075 to 0.3 (e.g., the depth is in a range from 0.15 to 0.6 when the wavelength/the metallization ratio is 0.5), and more preferably to a depth with the wavelength of surface acoustic wave/the metallization ratio to be in a range from 0.115 to 0.3 (e.g., the depth is in a range from 0.23 to 0.6 when the wavelength/the metallization ratio is 0.5). Here, when the cross section of the embedded electrode is not perpendicular to the substrate surface, the metallization ratio and the electrode width can be an effective metallization ratio and an effective electrode width, respectively. The same applies hereinafter.

Further, the piezoelectric substrate may be formed from a $LiTaO_3$ crystal and the interdigital transducer electrode may be formed from at least one of Ag, Mo, Cu and Ni. In this case, the interdigital transducer electrode is embedded in the piezoelectric substrate from the surface thereof preferably to a depth with the wavelength of surface acoustic wave/the metallization ratio to be in a range from 0.08 to 0.3 (e.g., the depth is in a range from 0.16 to 0.6 when the wavelength/the metallization ratio is 0.5), and more preferably to a depth with the wavelength of surface acoustic wave/the metallization ratio to be in a range from 0.09 to 0.3 (e.g., the depth is in a range from 0.18 to 0.6 when the wavelength/the metallization ratio is 0.5).

Further, the piezoelectric substrate may be formed from a $LiTaO_3$ crystal and the interdigital transducer electrode may be formed from at least one of Pt, Au, W, Ta and Hf. In this case, the interdigital transducer electrode is embedded in the piezoelectric substrate from the surface thereof preferably to a depth with the wavelength of surface acoustic wave/the metallization ratio to be in a range from 0.08 to 0.3 (e.g., the depth is in a range from 0.16 to 0.6 when the wavelength/the metallization ratio is 0.5), and more preferably to a depth with the wavelength of surface acoustic wave/the metallization ratio in a range from 0.125 to 0.3 (e.g., the depth is in a range from 0.25 to 0.6 when the wavelength/the metallization ratio is 0.5).

Further, the piezoelectric substrate may be formed from a $LiNbO_3$ crystal and the interdigital transducer electrode may be formed from at least one of Ti, Al and Mg alloys. In this case, the interdigital transducer electrode is embedded in the piezoelectric substrate from the surface thereof preferably to a depth with the wavelength of surface acoustic wave/the metallization ratio to be in a range from 0.07 to 0.3 (e.g., the depth is in a range from 0.14 to 0.6 when the wavelength/the metallization ratio is 0.5), and more preferably to a depth with the wavelength of surface acoustic wave/the metallization ratio to be in a range from 0.105 to 0.3 (e.g., the depth is in a range from 0.21 to 0.6 when the wavelength/the metallization ratio is 0.5).

Further, the piezoelectric substrate may be formed from a $LiNbO_3$ crystal and the interdigital transducer electrode may be formed from at least one of Ag, Mo, Cu and Ni. In this case, the interdigital transducer electrode is embedded in the piezoelectric substrate from the surface thereof preferably to a depth with the wavelength of surface acoustic wave/the metallization ratio to be in a range from 0.065 to 0.3 (e.g., the depth is in a range from 0.13 to 0.6 wavelengths when the wavelength/the metallization ratio is 0.5), and more preferably to a depth with the wavelength of surface acoustic wave/the metallization ratio to be in a range from 0.09 to 0.3 (e.g., the depth is in a range from 0.18 to 0.6 wavelengths when the wavelength/the metallization ratio is 0.5).

Further, the piezoelectric substrate may be formed from a $LiNbO_3$ crystal and the interdigital transducer electrode may be formed from at least one of Pt, Au, W, Ta and Hf. In this case, the interdigital transducer electrode is embedded in the piezoelectric substrate from the surface thereof preferably to a depth with the wavelength of surface acoustic wave/the metallization ratio to be in a range from 0.075 to 0.3 (e.g., the depth is in a range from 0.15 to 0.6 when the wavelength/the metallization ratio is 0.5), and more preferably to a depth with the wavelength of surface acoustic wave/the metallization ratio to be in a range from 0.115 to 0.3 (e.g., the depth is in a range from 0.23 to 0.6 wavelengths when the wavelength/the metallization ratio is 0.5).

Further, the piezoelectric substrate may be formed from a $LiTaO_3$ crystal and the Euler angles may be preferably in the range of (0°+/−10°, 112° to 140°, 0°+/−5°) or crystallographically equivalent Euler angles thereto, and more preferably in the range of (0°+/−10°, 120° to 132°, 0°+/−5°) or crystallographically equivalent Euler angles thereto.

Further, the piezoelectric substrate may be formed from a $LiNbO_3$ crystal and the Euler angles may be preferably in the range of (0°+/−25°, 78° to 153°, 0°+/−5°) or crystallographically equivalent Euler angles thereto, and more preferably in the range of (0°+/−20°, 87° to 143°, 0°+/−5°) or crystallographically equivalent Euler angles thereto.

Here, the Euler angles (φ, θ, ψ) are expressed in a right-handed system and represent the cut surface of the piezoelectric substrate and the propagation direction of the surface acoustic wave. Thus, with respect to crystal axes X, Y and Z in a crystal such as $LiTaO_3$ or $LiNbO_3$ forming the piezoelectric substrate, X'-axis is obtained when X-axis is φ rotated counterclockwise about Z-axis as the rotation axis. Next, Z'-axis is obtained when Z-axis is θ rotated counterclockwise about X'-axis as the rotation axis. Then, Z'-axis is defined as the normal, and the plane including X'-axis is defined as the cut surface of the piezoelectric substrate.

Further, the direction obtained when X'-axis is ψ rotated counterclockwise about Z'-axis as the rotation axis is defined as the propagation direction of the surface acoustic wave. Still further, the axis perpendicular to X'-axis and Z'-axis is obtained as Y'-axis by Y-axis moving due to these rotations.

According to the definition of the Euler angles, the X-direction propagation of the 40°-rotated Y-plate is expressed as the Euler angles (0°, 130°, 0°) and the 90° X-direction propagation of the 40°-rotated Y-plate is expressed as the Euler angles (0°, 130°, 90°). It is to be understood that cutting the piezoelectric substrate at desired Euler angles may cause nearly an error of +/−0.5° at a maximum to each component of the Euler angles. Regarding the shape of an interdigital transducer electrode, nearly an error of +/−3° may generated in the propagation direction iv. Regarding the characteristics of the acoustic wave, there may be almost no characteristic difference due to the shift of about +/−5° for φ and ψ of the Euler angles (φ, θ, ψ).

The device may include at least one of a support substrate, a film, and a multi-layer film provided in contact with a surface of the piezoelectric substrate opposite to the surface on which the interdigital transducer electrode is provided, and the support substrate may allow a transverse sound velocity or equivalent transverse sound velocity in a range from 2000 to 3000 m/s or from 6000 to 8000 m/s, and the piezoelectric substrate may have a thickness in a range from 0.2 to 20 wavelengths.

The device may include at least one of a support substrate, a film, and a multi-layer film provided in contact with a surface of the piezoelectric substrate opposite to the surface on which the interdigital transducer electrode is provided, and the support substrate may allow a transverse sound velocity or equivalent transverse sound velocity in a range from 3000 to 6000 m/s, and the piezoelectric substrate may have a thickness in a range from 2 to 20 wavelengths.

The device may include at least one of a support substrate, a film and a multi-layer film provided in contact with a surface of the piezoelectric substrate opposite to the surface on which the interdigital transducer electrode is provided, and the linear expansion coefficient of the support substrate may be $10.4 \times 10^{-6}/°$ C. or less. The thickness ratio TR of support substrate/piezoelectric substrate may be a value of TR or greater, where TR can be defined by Equation (1) below.

$$TR = \alpha \times 0.55 \times 10^6 + 2.18 \quad (1),$$

where α is a linear expansion coefficient.

Advantageous Effects of Invention

According to the present invention, it may be possible to provide a high-order mode surface acoustic wave device by which good characteristics can be obtained and also sufficient mechanical strength can be maintained even in a high frequency band of 3.8 GHz or greater.

BRIEF DESCRIPTION OF DRAWINGS

FIG. 1(a) shows a top view of a conventional surface acoustic wave device [Al interdigital transducer electrode/ 42°-rotated Y-plate X-propagation LiTaO₃ crystal], FIG. 1(b) shows a cross-sectional view thereof, and FIG. 1(c) is a graph showing impedance-frequency characteristics of the surface acoustic wave device shown in FIGS. 1(a) and 1(b).

FIG. 2(a) shows a high-order mode surface acoustic wave device according to an embodiment of the present invention, FIG. 2(b) shows a variation of the device of FIG. 2(a) including a film, FIG. 2(c) shows another variation of the device of FIG. 2(a) including a protruded interdigital transducer electrode, FIG. 2(d) shows another variation of the device of FIG. 2(a) including a support substrate, FIG. 2(e) shows another variation of the device of FIG. 2(d) including a protruded interdigital transducer electrode, and FIG. 2(f) shows another variation of the device of FIG. 2(d) including a multi-layer film between the piezoelectric substrate and the support substrate.

FIG. 3 shows a cross-sectional view of the high-order mode surface acoustic wave device shown in FIGS. 2(a) to 2(f) in which a lateral side of the embedded electrode is not perpendicular to a substrate surface.

FIG. 4(a) is a graph showing impedance-frequency characteristics of a high-order mode surface acoustic wave device [Al electrode/(0°, 126.5°, 0°) LiTaO₃ crystal substrate] shown in FIG. 2(a) when the metallization ratio of the interdigital transducer electrode is 0.5, FIG. 4(b) is a graph enlarging a portion around the first-order mode resonance frequency shown in FIG. 4(a), FIG. 4(c) is a graph showing a displacement distribution at the first-order mode resonant frequency thereof, and FIG. 4(d) is a graph showing first-order mode impedance-frequency characteristics of the device when the metallization ratio of the interdigital transducer electrode is 0.7.

FIG. 5 is a graph showing impedance-frequency characteristics of a high-order mode surface acoustic wave device [Al electrode (metallization ratio of 0.5)/(0°, 126.5°, 0°) LiTaO₃ crystal substrate] shown in FIG. 2(c).

FIG. 6(a) is a graph showing impedance-frequency characteristics of a high-order mode surface acoustic wave device [Al electrode (metallization ratio of 0.5/(0°, 126.5°, 0°) LiTaO₃ crystal substrate] shown in FIG. 2(d) when the support substrate is formed from a Si substrate, and FIG. 6(b) is a graph showing impedance-frequency characteristics of the device when the support substrate is formed from a quartz substrate.

FIG. 7 is a graph showing first-order mode impedance-frequency characteristics of a high-order mode surface acoustic wave device [Al electrode (metallization ratio of 0.5/(0°, 126.5°, 0°) LiTaO₃ crystal substrate] shown in FIG. 2(f).

FIG. 8(a) is a graph showing impedance-frequency characteristics of a high-order mode surface acoustic wave device [Al electrode (metallization ratio of 0.5/(0°, 116°, 0°) LiNbO₃ crystal substrate] shown in FIG. 2(a), and FIG. 8(b) is a graph enlarging a portion around the first-order mode resonance frequency shown in FIG. 8(a).

FIG. 9 is a graph showing impedance-frequency characteristics of a high-order mode surface acoustic wave device [Cu electrode (metallization ratio of 0.5)/(0°, 116°, 0°) LiNbO₃ crystal substrate] shown in FIG. 2(a).

FIG. 10(a) is a graph showing a relationship between a thickness of each electrode and a first-order mode fractional bandwidth, and FIG. 10(b) is a graph showing a relationship between the thickness of each electrode and the first-order mode impedance ratio, for a high-order mode surface acoustic wave device [interdigital transducer electrode (metallization ratio of 0.5)/(0°, 126.5°, 0°) LiTaO₃ crystal substrate] shown in FIG. 2(a), where the interdigital transducer electrode is an Al, Cu or Au electrode.

FIG. 11(a) is a graph showing a relationship between θ and a first-order mode fractional bandwidth, and FIG. 11(b) is a graph showing a relationship between θ and the first-order mode impedance ratio, for a high-order mode surface acoustic wave device [Al electrode (metallization ratio of 0.5)/(0°, θ, 0°) LiTaO₃ crystal substrate] shown in FIG. 2(a).

FIG. 12 is a graph showing a relationship between φ and a first-order mode impedance ratio for a (φ, 126.5°, 0°) LiTaO₃ crystal substrate according to a high-order mode surface acoustic wave device [Al electrode (metallization ratio of 0.5)/(0°, θ, 0°) LiTaO₃ crystal substrate] shown in FIG. 2(a).

FIG. 13(a) is a graph showing a relationship between the thickness of each electrode and the first-order mode fractional bandwidth, and FIG. 13(b) is a graph showing a relationship between the thickness of each electrode and the first-order mode impedance ratio, for a high-order mode surface acoustic wave device [interdigital transducer electrode (metallization ratio of 0.5)/(0°, 116°, 0°) LiNbO₃ crystal substrate] shown in FIG. 2(a), where the interdigital transducer electrode is an Al, Cu or Au electrode.

FIG. 14(a) is a graph showing a relationship between θ and the first-order mode fractional bandwidth, and FIG. 14(b) is a graph showing a relationship between θ and the first-order mode impedance ratio, for a high-order mode surface acoustic wave device [Al electrode (metallization ratio of 0.5)/(0°, θ, 0°) LiNbO₃ crystal substrate] shown in FIG. 2(a).

FIG. 15 is a graph showing a relationship between φ and the first-order mode impedance ratio for a (φ, 116°, 0°) LiNbO₃ crystal substrate according to a high-order mode surface acoustic wave device [Al electrode (metallization ratio of 0.5)/(φ, θ, 0°) LiNbO₃ crystal substrate] shown in FIG. 2(a).

FIG. 16(a) is a graph showing a relationship between the metallization ratio of an Al electrode and the first-order mode phase velocity, and FIG. 16(b) is a graph showing a relationship between the metallization ratio of an Al electrode and the first-order mode impedance ratio, for a high-order mode surface acoustic wave device [Al electrode/(0°, 126.5°, 0°) LiTaO₃ crystal substrate] shown in FIG. 2(a).

FIG. 17 is a graph showing impedance-frequency characteristics of a high-order mode surface acoustic wave device [Al electrode (metallization ratio of 0.85)/(0°, 126.5°, 0°) LiTaO₃ crystal substrate] shown in FIG. 2(a).

FIG. 18(a) is a graph showing a relationship between a thickness of an interdigital transducer electrode and zeroth-order to third-order mode phase velocities, and FIG. 18(b) is a graph showing a relationship between a thickness of an interdigital transducer electrode and zeroth-order to third-order mode impedance ratios, for a high-order mode surface acoustic wave device shown in FIG. 17.

FIG. 19 is a graph showing a dependence of the first-order mode impedance ratio on a LiTaO₃ crystal substrate thickness for a high-order mode surface acoustic wave device [Cu electrode with a groove depth of 0.2λ (metallization ratio of 0.5)/(0°, 126.5°, 0°) LiTaO₃ crystal substrate/support substrate] shown in FIG. 2(d) when the support substrate is formed from c-sapphire, Si, quartz, Pyrex glass, or lead glass.

FIG. 20 is a graph showing a dependence of the first-order mode impedance ratio on a LiNbO₃ crystal substrate thickness for a high-order mode surface acoustic wave device [Cu electrode with a groove depth of 0.23λ (metallization ratio of 0.5)/(0°, 116°, 0°) LiNbO₃ crystal substrate/support substrate] shown in FIG. 2(d) when the support substrate is formed from c-sapphire, Si, quartz, Pyrex glass, or lead glass.

FIG. 21 is a graph showing how temperature coefficients of frequency for high-order mode surface acoustic wave devices [Al electrode with groove depth of 0.3λ (metallization ratio of 0.5)/(0°, 126.5°, 0°) LiTaO₃ crystal substrate/ support substrate] and [Al electrode with groove depth of 0.3λ (metallization ratio of 0.5)/(0°, 116°, 0°) LiNbO₃ crystal substrate/support substrate] shown in FIG. 2(d) depend on the LiTaO₃ and LiNbO₃ crystal substrate thicknesses per support substrate linear expansion coefficient.

DESCRIPTION OF EMBODIMENTS

Embodiments of the present invention will now be described with reference to the accompanying drawings. FIGS. 2 to 21 are depicted for high-order mode surface acoustic wave devices according to embodiments of the present invention. As shown in FIG. 2(a), a high-order mode surface acoustic wave (SAW) device 10 includes a piezoelectric substrate 11 and an interdigital transducer (IDT) electrode 12 for using a high-order mode SAW.

The piezoelectric substrate 11 is formed from LiTaO₃ or LiNbO₃ crystal. The interdigital transducer electrode 12 is embedded in a surface of the piezoelectric substrate 11. It is to be understood that the interdigital transducer electrode 12 may include an upper surface provided on the same plane as the surface of the piezoelectric substrate 11 or below the plane, and may protrude from the surface of the piezoelectric substrate 11. As described hereinafter, the electrode thickness may be referred to as the electrode thickness embedded in a groove.

As shown in FIG. 2(b), the high-order mode surface acoustic wave device 10 may include a film 13 provided to cover the surface of the piezoelectric substrate 11 between gaps of the interdigital transducer electrode 12. The film 13 may be a SiO₂ film, for example. The interdigital transducer electrode 12 includes an upper surface provided on the same plane as a surface of the film 13. Further, in the high-order mode surface acoustic wave device 10, a surface of the interdigital transducer electrode 12 may be coplanar with or provided below a surface of the piezoelectric substrate 11. As shown in FIG. 2(c), the interdigital transducer electrode 12 may be provided to protrude from the surface of the piezoelectric substrate 11.

Further, as shown in FIG. 2(d), the high-order mode surface acoustic wave device 10 may include a support substrate 14, the piezoelectric substrate 11 may be formed from a film with smaller thickness, and the support substrate 14 may be provided in contact with a surface of the piezoelectric substrate 11 opposite to the surface on which the interdigital transducer electrode 12 is provided. The support substrate 14 may be a substrate formed from semiconductor or insulator, such as Si, quartz, sapphire, glass, silica, germanium, or alumina substrate. Further, in addition to the configuration of FIG. 2(d), the film 13 may be formed on a surface of the piezoelectric substrate 11 as shown in FIG. 2(b). Still further, in addition to the configuration of FIG. 2(d), the high-order mode surface acoustic wave device 10 may be configured to include the interdigital transducer electrode 12 protruding from the surface of the piezoelectric substrate 11 as shown in FIG. 2(e) similar to the configuration of FIG. 2(c).

Also, in addition to the configuration of FIG. 2(d), the high-order mode surface acoustic wave device 10 may be configured to include a multi-layer film 15 provided between the piezoelectric substrate 11 and the support substrate 14 as shown in FIG. 2(f). For example, the multi-layer film 15 can be an acoustic multi-layer film that a plurality of layers having different acoustic impedances are stacked into. Further, in addition to the configuration of FIG. 2(f), the film 13 may be formed on the surface of the piezoelectric substrate 11 as shown in FIG. 2(b), or the interdigital transducer electrode 12 may protrude from the surface of the piezoelectric substrate 11 as shown in FIG. 2(*c*).

The high-order mode surface acoustic wave device 10 may have the interdigital transducer electrode 12 embedded in a surface of the piezoelectric substrate 11 to excite a SAW in a high-order mode (i.e., first-order mode, second-order mode, third-order mode, or the like) and achieve a high-order mode enabling a greater impedance ratio. The high-order mode may be referred to as an overtone for exciting an approximately double, triple, or quadruple frequency. The high-order mode surface acoustic wave device 10 may use such a high-order mode to obtain higher frequencies and may achieve good characteristics even in a high frequency band of 3.8 GHz or greater. Further, using such a high-order mode may eliminate the need to super thin the piezoelectric substrate or reduce the period of the interdigital transducer electrode even in a high frequency band of 3.8 GHz or greater such that a sufficient mechanical strength can be maintained.

As an example, the high-order mode surface acoustic wave device 10 can be manufactured as follows. Firstly, an electrode groove in which an interdigital transducer electrode 12 is to be embedded is formed on a surface of a piezoelectric substrate 11. Thus, a resist or the like is applied on a portion of the surface of the piezoelectric substrate 11 that would not have the electrode groove formed and then the surface of the piezoelectric substrate 11 is dry etched by argon (Ar) ion or the like to form the electrode groove. In this case, a material allowing for an etching speed slower than that of the piezoelectric substrate 11 may be used instead of the resist or as a material other than the resist. Also, other than such a dry etching, a wet etching method may be used.

Next, metal for the electrode is deposited on the entire surface of the piezoelectric substrate 11 with a thickness sufficient for the electrode groove to be filled up to the surface of the piezoelectric substrate 11. Then, the resist is removed by wet etching, cleaning, or the like. Thus, the interdigital transducer electrode 12 embedded in the electrode groove can be formed. It is to be understood that, when the thickness of the interdigital transducer electrode 12 is not sufficient for the desired thickness, an additional step of etching or the like may be performed to adjust the thickness of the interdigital transducer electrode 12.

An impedance ratio, a fractional bandwidth, and the like for the high-order mode surface acoustic wave device 10 in each configuration shown in FIGS. 2(*a*) to 2(*f*) are estimated below. Referring to FIG. 1(*c*), the impedance ratio is provided as 20×log (Za/Zr), where Za represents an anti-resonance impedance at the highest anti-resonance frequency fa, and Zr represents a resonance impedance at the lowest resonance frequency fr among the impedances characterized by resonance. The fractional bandwidth is provided as (fa-fr)/fr. Further, referring to FIG. 1(*a*), the metallization ratio of the interdigital transducer electrode 52 is provided as a ratio of the electrode finger width F of the interdigital transducer electrode 52 divided by a half of the period λ of the electrode finger (which is a sum of the electrode finger width F and the gap G between adjacent electrode fingers), i.e., F/(F+G)=2×F/λ.

As shown in FIG. 3, there may be a case where an electrode of the interdigital transducer electrode 12 is embedded in the substrate surface to have an angled side, not a perpendicular side. In this case, the metallization ratio and electrode width may be regarded as effective metallization ratio and electrode width, respectively. Thus, when angle γ between a side surface of the electrode groove and a top surface of the piezoelectric substrate 11 is 90 degrees or less, the effective electrode width "c" can be provided as (a+b)/2 and the effective metallization ratio can be provided as c/(c+e), where "a" represents the width of the top surface, "b" represents the width of the bottom surface, and "d" represents the embedded depth of each electrode. The embedded depth of the electrode remains to be "d."

The interdigital transducer electrode 12 herein has a period λ of 1 μm and a metallization ratio of 0.5, i.e., the electrode finger width is 0.25 μm and the electrode finger gap is 0.25 μm. It is to be understood that Euler angles (φ, θ, ψ) are merely represented as (φ, θ, ψ) hereinafter. Further, the thickness and the like of the piezoelectric substrate 11 or the interdigital transducer electrode 12 are represented as magnification factors with respect to the wavelength λ (period of interdigital transducer electrode) of a surface acoustic wave device to be used.

FIGS. 4(*a*) to 4(*d*) show impedance-frequency characteristics and the like of a high-order mode surface acoustic wave device 10 having a structure shown in FIG. 2(*a*). The piezoelectric substrate 11 is a (0°, 126.5°, 0°) LiTaO₃ crystal. The interdigital transducer electrode 12 is formed from an Al electrode having a thickness of 0.36λ and embedded to a depth of 0.36λ from the surface of the piezoelectric substrate 11. FIGS. 4(*a*) and 4(*b*) show impedance-frequency characteristics and FIG. 4(*c*) shows a displacement distribution at the first-order mode resonance frequency when the metallization ratio of the interdigital transducer electrode 12 is 0.5. FIG. 4(*b*) is an enlarged view of a portion around the first-order mode resonance frequency shown in FIG. 4(*a*). Further, FIG. 4(*d*) shows impedance-frequency characteristics when the metallization ratio of the interdigital transducer electrode 12 is 0.7.

As shown in FIG. 4(*a*), embedding the interdigital transducer electrode 12 in the piezoelectric substrate 11 was found to result in a zeroth-order mode resonance frequency of 4.5 GHz, which is 1.36 times as high as a zeroth-order mode resonance frequency of 3.3 GHz for the conventional SAW device shown in FIGS. 1(*a*)-1(*c*). Further, as shown in FIGS. 4(*a*) and 4(*b*), the first-order mode resonance frequency of 9.6 GHz was found to be greatly excited, which is approximately twice as high as a zeroth-order mode resonance frequency of 4.5 GHz. The fractional bandwidth and impedance ratio for the first-order mode were 3% and 67 dB, respectively, and an impedance ratio greater than that of the conventional SAW device shown in FIG. 1 was found to be achieved. The first-order mode resonance frequency was about 2.9 times as high as the resonance frequency for the conventional SAW device.

Further, the first-order mode resonance frequency of 9.5 GHz is found to be a high-order mode (first-order mode) of the fundamental mode (zeroth-order mode) in that, as shown in FIG. 4(*c*), the first-order mode is formed only from the shear horizontal (SH) component and the resonance frequency for the conventional SAW device is also formed from the SH component. It is to be understood that the letters "L" and "SV" indicated in FIG. 4(*c*) represent the longitudinal component and the shear vertical component, respectively. Additionally, as shown in FIG. 4(*d*), configuring the metallization ratio as 0.7 was found to cause the first-order mode resonance frequency to be 11.2 GHz, the fractional bandwidth to be 3.4%, and the impedance ratio to be 70 dB. These respective values are 1.2 times greater, 13% broader, and 3 dB greater than those of the metallization ratio of 0.5.

FIG. 5 shows impedance-frequency characteristics of a high-order mode surface acoustic wave device 10 having a structure shown in FIG. 2(*c*). The piezoelectric substrate 11 is a (0°, 126.5°, 0°) LiTaO$_3$ crystal. The interdigital transducer electrode 12 is configured as an Al electrode having a thickness of 0.38λ and is embedded to a depth of 0.36λ from the surface of the substrate 11 while protruding 0.02λ from the surface of the substrate 11. The interdigital transducer electrode 12 has a metallization ratio of 0.5.

As shown in FIG. 5, the high-order mode (first-order mode) resonance frequency was found to be slightly higher than that of FIGS. 4(a) and 4(b). Further, the impedance ratio is as small as 50 dB while the fractional bandwidth is as narrow as 1%, which can be suitable for narrower bandwidth applications. Still further, the excitation at the fundamental mode (zeroth-order mode) that might cause spurious emissions was found to be smaller.

FIG. 6 shows impedance-frequency characteristics of a high-order mode surface acoustic wave device 10 having a structure shown in FIG. 2(d). The piezoelectric substrate 11 is a (0°, 126.5°, 0°) LiTaO$_3$ crystal having a thickness of 0.5λ. The interdigital transducer electrode 12 is configured as an Al electrode having a thickness of 0.36λ and is embedded to a depth of 0.36λ from the surface of the piezoelectric substrate 11. The interdigital transducer electrode 12 has a metallization ratio of 0.5. The support substrate 14 is formed from Si or quartz and has a thickness of 350 μm in any case. The support substrate 14 is bonded to the piezoelectric substrate 11 by adhesive or direct bonding. FIG. 6(a) shows impedance-frequency characteristics when the support substrate 14 is configured as a Si substrate and FIG. 6(b) shows impedance-frequency characteristics when the support substrate 14 is configured as a quartz substrate.

As shown in FIG. 6(a), the first-order mode resonance frequency, the fractional bandwidth, and the impedance ratio for the Si support substrate were found to be 9 GHz, 2.8%, and 71 dB, respectively. Further, as shown in FIG. 6(b), the first-order mode resonance frequency, the fractional bandwidth, and the impedance ratio for the quartz substrate were found to be 9 GHz, 3.5%, and 68 dB, respectively. By comparing FIGS. 6(a) and 6(b) with FIG. 4(b), providing the support substrate 14 was found to cause the impedance ratio to be greater. It is to be understood that, in order to obtain a greater impedance ratio, the piezoelectric substrate 11 may be thinner than the support substrate 14, i.e., the thickness may be preferably 20 wavelengths or less, and more preferably 10 wavelengths or less.

FIG. 7 shows impedance-frequency characteristics of a high-order mode surface acoustic wave device 10 having a structure shown in FIG. 2(f). The piezoelectric substrate 11 is a (0°, 126.5°, 0°) LiTaO$_3$ crystal having a thickness of 0.5λ. The interdigital transducer electrode 12 is configured as an Al electrode having a thickness of 0.36λ and is embedded to a depth of 0.36λ from the surface of the piezoelectric substrate 11. The interdigital transducer electrode 12 has a metallization ratio of 0.5. The multi-layer film 15 is formed from an acoustic multi-layer film in which a SiO$_2$ layer (with a thickness of 0.25 μm) and a Ta layer (with a thickness of 0.25 μm) having different acoustic impedances are alternately stacked into a six-layer film. The support substrate 14 is configured as a Si substrate having a thickness of 350 μm. It is to be understood that the layers may include more or fewer than six layers.

As shown in FIG. 7, the first-order mode resonance frequency, the fractional bandwidth, and the impedance ratio were found to be 9.5 GHz, 2.6%, and 69 dB, respectively. By comparing FIG. 7 with FIG. 6(a), providing the multi-layer film 15 was found to cause the bandwidth to be slightly narrower and the impedance ratio to be slightly smaller.

FIGS. 8(a) and 8(b) show impedance-frequency characteristics of a high-order mode surface acoustic wave device 10 having a structure shown in FIG. 2(a). FIG. 8(a) shows the impedance-frequency characteristics and FIG. 8(b) enlarges a portion around the first-order mode resonance frequency shown in FIG. 8(a). The piezoelectric substrate 11 is a (0°, 116°, 0°) LiNbO$_3$ crystal. The interdigital transducer electrode 12 is configured as an Al electrode having a thickness of 0.35λ and is embedded to a depth of 0.35λ from the surface of the piezoelectric substrate 11. The interdigital transducer electrode 12 has a metallization ratio of 0.5.

As shown in FIGS. 8(a) and 8(b), the high-order mode (first-order mode) of 10.4 GHz was found to be greatly excited when the piezoelectric substrate 11 was formed from a LiNbO$_3$ crystal similar to the case of the piezoelectric substrate 11 formed from a LiTaO$_3$ crystal (see FIGS. 4(a) to 4(d)). The fractional bandwidth and impedance ratio for the first-order mode were 6.4% and 68 dB, respectively, and the bandwidth and impedance ratio were found to be broader and greater in comparison with those of the first-order mode of the LiTaO$_3$ crystal shown in FIG. 4(b).

FIG. 9 shows impedance-frequency characteristics of a high-order mode surface acoustic wave device 10 having a structure shown in FIG. 2(a). The piezoelectric substrate 11 is a (0°, 116°, 0°) LiNbO$_3$ crystal. The interdigital transducer electrode 12 is configured as a Cu electrode having a thickness of 0.24λ and is embedded to a depth of 0.24λ from the surface of the piezoelectric substrate 11. The interdigital transducer electrode 12 has a metallization ratio of 0.5.

As shown in FIG. 9, the first-order mode resonance frequency when the interdigital transducer electrode 12 was a Cu electrode was 9.5 GHz, which was slightly lower than that of an Al electrode (see FIG. 8(a)); however, even though the Cu electrode was formed thinner (shallower) than the Al electrode, an impedance ratio of 68 dB comparable with that of the Al electrode was found to be obtained.

FIG. 10(a) shows a relationship between the thickness of the interdigital transducer electrode 12 and the fractional bandwidth of a high-order mode surface acoustic wave device 10 having a structure shown in FIG. 2(a), and FIG. 10(b) shows a relationship between the thickness of the interdigital transducer electrode 12 and the impedance ratio of the device. The piezoelectric substrate 11 is a (0°, 126.5°, 0°) LiTaO$_3$ crystal. The piezoelectric electrode 12 is configured as an Al, Cu, or Au electrode. The interdigital transducer electrode 12 has a metallization ratio of 0.5. FIGS. 10(a) and 10(b) show a relationship between the thickness of each electrode and the fractional bandwidth and a relationship between the thickness of each electrode and the first-order mode impedance ratio, respectively, when each electrode thickness (depth) varies from 0.02λ to 0.6λ.

As shown in FIG. 10(a), the Al electrode was found to have the broadest bandwidth, and the Cu and Au electrodes were found to have narrower bandwidths in this order. Further, each electrode was found to have a broader bandwidth as the thickness (depth) becomes greater. Yet further, as shown in FIG. 10(b), the impedance ratio was found to be 50 dB or greater when the Al electrode had a depth in a range from 0.15λ to 0.6λ, when the Cu electrode had a depth in a range from 0.16λ to 0.6λ, and when the Au electrode had a depth in a range from 0.16λ to 0.6λ. Still further, the impedance ratio was found to be 60 dB or greater when the Al electrode had a depth in a range from 0.23λ to 0.6λ, when the Cu electrode had a depth in a range from 0.18λ to 0.6λ, and when the Au electrode had a depth in a range from 0.25λ to 0.6λ. Yet still further, the impedance ratio was found to be 65 dB or greater when the Al electrode had a depth in a range from 0.3λ to 0.6λ, when the Cu electrode had a depth in a range from 0.29λ to 0.6λ, and when the Au electrode had a depth in a range from 0.55λ to 0.6λ.

It is to be understood that the product of the electrode thickness and the metallization ratio is constant, e.g., when the metallization ratio is 0.5 and the electrode thickness is 0.15λ, the electrode thickness is (0.5×0.15λ)/0.75=0.10λ at the metallization ratio of 0.75. Thus, when the metallization ratio is 0.5 and the thickness of the Al electrode is 0.15λ, for example, the thickness of the Al electrode may be 0.10λ or greater at the metallization ratio of 0.75.

The relationship between the thickness of each electrode and the impedance ratio will be understood to be constant not only for the structure shown in FIG. 2(a) but also for the structures shown in FIGS. 2(b) to 2(f). Further, the relationship between the thickness of each electrode and the impedance ratio may exhibit the same tendency as that of the Al electrode when the electrode material (such as Ti or Mg alloy) has a density in a range from 1500 to 6000 kg/m$^3$, as that of the Cu electrode when the electrode material (such as Ag, Mo, or Ni) has a density in a range from 6000 to 12000 kg/m$^3$, and as that of the Au electrode when the electrode material (such as Pt, W, Ta, or Hf) has a density in a range from 12000 to 23000 kg/m$^3$. Still further, when the electrode material to be used is an alloy or a stack of different metals, the tendency of the relationship between the electrode thickness and the impedance ratio may be determined by an average density calculated from the respective materials.

FIGS. 11(a) and 11(b) show a relationship between the Euler angles of the piezoelectric substrate 11 and the first-order mode fractional bandwidth and a relationship between the Euler angles thereof and the first-order mode impedance ratio, respectively, for a high-order mode surface acoustic wave device 10 having a structure shown in FIG. 2(a). The piezoelectric substrate 11 is a (0°, θ, 0°) LiTaO$_3$ crystal. The interdigital transducer electrode 12 is configured as an Al electrode having a thickness of 0.36λ and is embedded to a depth of 0.36λ from the surface of the piezoelectric substrate 11. The interdigital transducer electrode 12 has a metallization ratio of 0.5. FIGS. 11(a) and 11(b) show a relationship between θ and the fractional bandwidth and a relationship between θ and the impedance ratio, respectively, when θ, which is a component of the Euler angles, varies from 0° to 180°.

As shown in FIGS. 11(a) and 11(b), the fractional bandwidth was found to be in a range from 2.5% to 3.2% and the impedance ratio was found to be 50 dB or greater when θ=112° to 140°. Further, the fractional bandwidth was found to be in a range from 2.6% to 2.7% and the impedance ratio was found to be 60 dB or greater when θ=120° to 132°. Still further, as shown in FIG. 12, the impedance ratio was found to be 50 dB or greater when φ=−20° to 20°, and to be 60 dB or greater when φ=−10° to 10°.

FIGS. 13(a) and 13(b) show a relationship between the thickness of the interdigital transducer electrode 12 and the first-order mode fractional bandwidth and a relationship between the thickness thereof and the first-order mode impedance ratio, respectively, for a high-order mode surface acoustic wave device 10 having a structure shown in FIG. 2(a). The piezoelectric substrate 11 is a (0°, 116°, 0°) LiNbO$_3$ crystal. The piezoelectric electrode 12 is configured as an Al, Cu, or Au electrode. The interdigital transducer electrode 12 has a metallization ratio of 0.5. FIGS. 13(a) and 13(b) show a relationship between the thickness of each electrode and the fractional bandwidth and a relationship between the thickness of each electrode and the impedance ratio, respectively, when the thickness (depth) varies from 0.02λ to 0.6λ.

As shown in FIG. 13(a), the Al electrode was found to have the broadest bandwidth, and the Cu and Au electrodes were found to have narrower bandwidths in this descending order when these electrodes have the same thickness (depth) at 0.1λ or greater. Further, each electrode was found to have a broader bandwidth as the thickness (depth) becomes greater when each electrode has a thickness of 0.4λ or greater. Still further, as shown in FIG. 13(b), the impedance ratio was found to be 50 dB or greater when the Al electrode had a thickness in a range from 0.14λ to 0.6λ, when the Cu electrode had a thickness in a range from 0.13λ to 0.6λ, and when the Au electrode had a thickness in a range from 0.15λ to 0.6λ. Yet still further, the impedance ratio was found to be 60 dB or greater when the Al electrode had a thickness in a range from 0.21λ to 0.6λ, when the Cu electrode had a thickness in a range from 0.18λ to 0.6λ, and when the Au electrode had a thickness in a range from 0.23λ to 0.6λ. It is to be understood that the product of the electrode thickness and the metallization ratio is constant as described above.

The relationship between the thickness of each electrode and the impedance ratio will be understood to be constant not only for the structure shown in FIG. 2(a) but also for the structures shown in FIGS. 2(b) to 2(f). Further, the relationship between the thickness of each electrode and the impedance ratio may exhibit the same tendency as that of the Al electrode when the electrode material (such as Ti or Mg alloy) has a density in a range from 1500 to 6000 kg/m$^3$, as that of the Cu electrode when the electrode material (such as Ag, Mo, or Ni) has a density in a range from 6000 to 12000 kg/m$^3$, and as that of the Au electrode when the electrode material (such as Pt, W, Ta, or Hf) has a density in a range from 12000 to 23000 kg/m$^3$. Still further, when the electrode material to be used is an alloy or a stack of different metals, the tendency of the relationship between the electrode thickness and the impedance ratio may be determined by an average density calculated from the respective materials.

FIGS. 14(a) and 14(b) show a relationship between the Euler angles of the piezoelectric substrate 11 and the first-order mode fractional bandwidth and a relationship between the Euler angles thereof and the first-order mode impedance ratio, respectively, for a high-order mode surface acoustic wave device 10 having a structure shown in FIG. 2(a). The piezoelectric substrate 11 is a (0°, θ, 0°) LiNbO$_3$ crystal. The interdigital transducer electrode 12 is configured as an Al electrode having a thickness of 0.3λ and is embedded to a depth of 0.3λ from the surface of the piezoelectric substrate 11. The interdigital transducer electrode 12 has a metallization ratio of 0.5. FIGS. 14(a) and 14(b) show a relationship between θ and the fractional bandwidth and a relationship between θ and the impedance ratio, respectively, when θ, which is a component of the Euler angles, varies from 50° to 180°.

As shown in FIGS. 14(a) and 14(b), the fractional bandwidth was found to be in a range from 4.4% to 6.5% and the impedance ratio was found to be 50 dB or greater when θ=78° to 153°. Further, the fractional bandwidth was found to be in a range from 5.2% to 6.5% and the impedance ratio was found to be 60 dB or greater when θ=87° to 143°. Still further, the fractional bandwidth was found to be in a range from 5.7% to 6.5% and the impedance ratio was found to be 65 dB or greater when θ=94° to 135°. Yet still further, as shown in FIG. 15, the impedance ratio was found to be 50 dB or greater when φ=−25° to 25°, and to be 70 dB or greater when φ=−10° to 10°.

FIGS. 16(a) and 16(b) show a relationship between the metallization ratio of the interdigital transducer electrode 12 and the first-order mode phase velocity and a relationship between the metallization ratio thereof and the first-order mode impedance ratio, respectively, for a high-order mode surface acoustic wave device 10 having a structure shown in FIG. 2(a). The piezoelectric substrate 11 is a (0°, 126.5°, 0°) LiTaO$_3$ crystal. The interdigital transducer electrode 12 is configured as an Al electrode having a thickness of 0.36λ and is embedded to a depth of 0.36λ from the surface of the piezoelectric substrate 11. FIGS. 16(a) and 16(b) show a relationship between the metallization ratio and the phase velocity and a relationship between the metallization ratio and the impedance ratio, respectively, when the metallization ratio of the Al electrode varies from 0.3 to 0.9.

As shown in FIG. 16(a), the phase velocity was found to be in a range from about 10000 to 11500 m/s, which can be summarized as a tendency that the greater the metallization ratio becomes, the greater the phase velocity becomes. Further, as shown in FIG. 16(b), the impedance ratio was found to be 50 dB or greater when the metallization ratio was 0.4 or greater, the impedance ratio was found to be 60 dB or greater when the metallization ratio was 4.5 or greater, the impedance ratio was found to be 65 dB or greater when the metallization ratio was 0.52 or greater, and the impedance ratio was found to be 70 dB or greater when the metallization ratio was 0.63 or greater.

FIG. 17 shows impedance-frequency characteristics of a high-order mode surface acoustic wave device 10 having a structure shown in FIG. 2(a). The piezoelectric substrate 11 is a (0°, 126.5°, 0°) LiTaO$_3$ crystal. The interdigital transducer electrode 12 is configured as an Al electrode having a thickness of 0.2λ and is embedded to a depth of 0.2λ from the surface of the piezoelectric substrate 11. The interdigital transducer electrode 12 has a metallization ratio of 0.85.

As shown in FIG. 17, high-order modes of the zeroth-order mode such as a first-order mode, a second-order mode, and a third-order mode were found to be excited. As shown in FIGS. 4(a)-4(d) and 8(a)-8(b), almost none of the second-order mode or the third-order mode was found when the metallization ratio was 0.5, and accordingly a greater metallization ratio can be understood to allow a high-order mode such as a second-order mode and a third-order mode to be excited.

FIGS. 18(a) and 18(b) show a relationship between the thickness of the interdigital transducer electrode 12 and the phase velocities for zeroth-mode to third-order mode and a relationship between the thickness of the interdigital transducer electrode 12 and the impedance ratios for zeroth-mode to third-order mode when the thickness of the interdigital transducer electrode 12 varies from 0.05λ to 0.55λ in the same structure as that of FIG. 17. As shown in FIG. 18(a), when the thickness of the interdigital transducer electrode 12 was 0.3λ, for example, the phase velocity was found to be about 2.7 times in the first-order mode, 4.7 times in the second-order mode, and about 6.9 times in the third-order mode as high as that of the zeroth-order mode. Further, as shown in FIG. 18(b), the impedance ratio in this condition was found to be 57 dB in the first-order mode, 40 dB in the second-order mode, and 45 dB in the third-order mode whereas 47 dB in the zeroth-order mode, and these high-order modes were sufficiently useful.

Table 1 shows densities, longitudinal sound velocities, and transverse sound velocities of support substrates for a high-order mode surface acoustic wave device [groove electrode/LiTaO$_3$ or LiNbO$_3$ crystal substrate/support substrate] shown in FIG. 2(d). The longitudinal sound velocity can be expressed as a square root of ($C_{33}$/density) and the transverse sound velocity can be expressed as a square root of ($C_{44}$/density), where $C_{ij}$ is an elastic stiffness constant. These are sorted into five groups A, B, C, D, and E according to the transverse sound velocities.

TABLE 1

| | Support substrate | Density (Kg/m$^3$) | Longitudinal sound velocity (m/s) | Transverse sound velocity (m/s) |
|---|---|---|---|---|
| | LiNbO$_3$ | 4640 | 7228 | 3578 |
| | LTaO$_3$ | 7454 | 6127 | 3604 |
| A | TeO$_2$ | 5990 | 4203 | 2103 |
| | Lead glass L | 4360 | 4127 | 2414 |
| | ZnO | 5665 | 6083 | 2733 |
| | Lead glass M | 5000 | 6020 | 2900 |
| B | Glass E | 2470 | 5500 | 3100 |
| | Glass D | 2440 | 5565 | 3408 |
| | Pyrex | 2230 | 5710 | 3494 |
| | Borosilicate glass | 2365 | 5620 | 3520 |
| | SiO$_2$ film | 2210 | 4675 | 3572 |
| | Fused silica | 2210 | 5960 | 3757 |
| | Silica glass | 2200 | 5976 | 3768 |
| C | Quartz | 2650 | 6360 | 4676 |
| D | Polycrystal Si | 2331 | 8945 | 5341 |
| | Monocrystal Si | 2331 | 8431 | 5844 |
| E | Sapphire | 3986 | 11178 | 6073 |
| | Alumina | 3800 | 10476 | 6198 |
| | SiC | 3200 | 11963 | 7603 |

FIG. 19 shows a dependence of the impedance ratio on a LiTaO$_3$ crystal substrate thickness for a high-order mode surface acoustic wave device [Cu electrode with groove depth of 0.2λ (metallization ratio of 0.5)/(0°, 126.5°, 0°) LiTaO$_3$ crystal substrate/support substrate] shown in FIG. 2(d) when the support substrate is formed from c-sapphire, Si, quartz, Pyrex glass, or lead glass. In this figure, open symbols represent characteristics without in-band ripples and solid symbols represent characteristics with in-band ripples. When the LiTaO$_3$ crystal thickness is 20 wavelengths or greater, the impedance ratios for all kinds of support substrates coincide with the impedance ratio of 62 dB, which is obtained when only the LiTaO$_3$ crystal substrate is included, i.e., there is no support substrate; however, when the LiTaO$_3$ crystal thickness is 20 wavelengths or less, the impedance ratios are greater than this amount.

In group A corresponding to transverse sound velocities between 2000 and 3000 m/s in Table 1, which are much lower than the transverse sound velocity of 3604 m/s for the LiTaO$_3$ crystal also indicated in Table 1, the lead glass having the velocity of 2414 m/s may result in an impedance ratio of 62 dB without in-band ripples when the LiTaO$_3$ crystal thickness is 0.2λ or greater and less than 20λ, and result in an impedance ratio of 63 dB or greater when the LiTaO$_3$ crystal thickness is 10λ or less. In group E corresponding to transverse sound velocities between 6001 and 8000 m/s in Table 1, which are much higher than the transverse sound velocity of LiTaO$_3$, the sapphire having the velocity of 6073 m/s may result in an impedance ratio of 62 dB or greater without in-band ripples when the LiTaO$_3$ crystal thickness is 0.2λ or greater and less than 20λ, and result in an impedance ratio of 63 dB or greater without in-band ripples when the LiTaO$_3$ crystal thickness is 0.2 or greater and less than 10λ.

Nevertheless, the Pyrex glass in group B corresponding to transverse sound velocities between 3000 and 4220 m/s, the quartz in group C corresponding to transverse sound velocities between 4220 and 5000 m/s, and the Si substrate in group D corresponding to transverse sound velocities between 4220 and 5000 m/s may result in in-band ripples when the LiTaO$_3$ crystal thickness is 0.2λ or greater and less than 2λ, result in an impedance ratio of 62 dB or greater when the LiTaO$_3$ crystal thickness is 2λ or greater and less than 20λ, and result in an impedance ratio of 64.5 dB or greater when the LiTaO$_3$ crystal thickness is between 2λ and 10λ.

FIG. 20 shows a dependence of the impedance ratio on a LiTaO$_3$ crystal substrate thickness for a high-order mode surface acoustic wave device [Cu electrode with groove depth of 0.23λ (metallization ratio of 0.5)/(0°, 112°, 0°) LiNbO$_3$ crystal substrate/support substrate] shown in FIG. 2(d) when the support substrate is formed from c-sapphire, Si, quartz, Pyrex glass, or lead glass. In this figure, open symbols represent characteristics without in-band ripples and solid symbols represent characteristics with in-band ripples. When the LiNbO$_3$ crystal thickness is 20 wavelengths or greater, the impedance ratios for all kinds of support substrates coincide with the impedance ratio of 68 dB, which is obtained when only the LiNbO$_3$ crystal substrate is included, i.e., there is no support substrate; however, when the LiNbO$_3$ crystal thickness is less than 20 wavelengths, the impedance ratios are greater than this amount.

The lead glass having the transverse sound velocity of 2414 m/s in group A indicated in Table 1, which corresponds to a much lower transverse sound velocity than the transverse sound velocity of 3604 m/s for the LiTaO$_3$ crystal also indicated in Table 1, may result in an impedance ratio between 68 and 80 dB or greater without in-band ripples when the LiTaO$_3$ crystal thickness is 0.2λ or greater and less than 20λ, and result in an impedance ratio of 71.5 dB or greater without in-band ripples when the LiTaO$_3$ crystal thickness is 10λ or less. Similarly, the sapphire having the transverse sound velocity of 6073 m/s in group C of Table 1, which is much higher than the transverse sound velocity for the LiTaO$_3$ crystal, may result in an impedance ratio between 68 and 71 dB without in-band ripples when the LiTaO$_3$ crystal thickness is 0.2λ or greater and less than 20λ, and result in an impedance ratio of 70 dB or greater without in-band ripples when the LiTaO$_3$ crystal thickness is 10λ or less.

Nevertheless, the Pyrex glass, quartz, and Si support substrates in groups B, C, and D, respectively, which correspond to the transverse sound velocities between 3000 and 6000 m/s close to that of the LiTaO$_3$ as indicated in Table 1, may result in in-band ripples when the LiTaO$_3$ crystal thickness is 0.2λ or greater and less than 20λ, result in an impedance ratio between 68 and 77 dB when the LiTaO$_3$ crystal thickness is between 2λ and 20λ, and result in an impedance ratio between 71.5 and 77 dB when the LiTaO$_3$ crystal thickness is between 2λ and less than 10λ.

It is to be understood that, when a film, e.g., SiO$_2$ film, SiO film, or SiO compound film such as SiOF film, is included between the LiTaO$_3$ or LiNbO$_3$ crystal piezoelectric substrate and the support substrate, an average transverse sound velocity of the film and the underlying support substrate should be considered. Even if a SiO$_2$ film, SiO compound film, or acoustic multi-layer film is interposed between the piezoelectric substrate and the support substrate, the optimum film thickness of the piezoelectric substrate can be determined by which one of groups A, B, and C corresponds to an apparent average of the sound velocities of these films within two wavelengths. In this case, the material of the first layer in contact with the piezoelectric substrate is weighed 70% and all the other subsequent layers are weighed 30%. For example, when the first layer is a SiO$_2$ film (with transverse sound velocity of 3572 m/s) having a thickness of 0.5 wavelengths and the support substrate has a thickness of 1.5 wavelengths, the average is calculated as (3572×0.5×0.7+6073×1.5×0.3)=3982 m/s, and a LiTaO$_3$ or LiNbO$_3$ crystal substrate can be used as a substrate having an optimum thickness in group E.

Table 2 shows linear expansion coefficients of LiTaO$_3$ and LiNbO$_3$ crystals as well as linear expansion coefficients of typical substrates smaller than those of LiTaO$_3$ and LiNbO$_3$ crystals. Table 2 shows a linear expansion coefficient of each type of support substrate used in a high-order mode surface acoustic wave device [groove electrode/piezoelectric substrate/support substrate] structure.

TABLE 2

| Substrate | Linear expansion coefficient ($10^{-6}$) |
| --- | --- |
| Synthetic quartz | 0.47 |
| Silica glass | 0.47 |
| Fused silica | 0.55 |
| Carbon C | 3.20 |
| Pyrex | 3.25 |
| SiC | 3.30 |
| Si | 3.35 |
| Carbon C compund | 4.20 |
| SiC compound | 4.2-4.5 |
| SiO$_2$ film | 4.50 |
| SiO compound (film) | 4.50 |
| Boron carbide B$_4$C$_5$ | 4.50 |
| Sapphire | 7.10 |
| Borosilicate glass | 7.20 |
| Alumina | 8.00 |
| Yttrium (Y$_2$O$_3$) | 8.20 |
| Spinel (MgAl$_2$O$_4$) | 8.40 |
| Quarts 90°X propagation | 10.35 |
| Quartz X propagation | 13.71 |
| LiNbO$_3$ crystal X propagation | 15.40 |
| LiTaO$_3$ crystal X propagation | 16.10 |

FIG. 21 shows how temperature coefficients of frequency for high-order mode surface acoustic wave devices [Al electrode with groove depth of 0.3λ (metallization ratio of 0.5)/(0°, 126.5°, 0°) LiTaO$_3$ crystal substrate/support substrate] and [Al electrode with groove depth of 0.3λ (metallization ratio of 0.5)/(0°, 112°, 0°) LiNbO$_3$ crystal substrate/support substrate] shown in FIG. 2(d) depend on the LiTaO$_3$ crystal/support substrate and LiNbO$_3$ crystal/support substrate per support substrate linear expansion coefficient. The vertical axis represents a temperature coefficient of frequency (TCF) that is expressed as a frequency change rate per temperature in Celsius (° C.) when the LiTaO$_3$ or LiNbO$_3$ crystal substrate/support substrate is used, i.e., (maximum frequency change amount when the temperature changes from −20° C. to 80° C.)/(maximum temperature change amount when the temperature changes from 100° C. to 20° C. (80 degrees herein)). The vertical axis on the left side represents a temperature coefficient of frequency when the LiTaO$_3$ crystal substrate is used, and the vertical axis on the right side represents a temperature coefficient of frequency when the LiNbO$_3$ crystal substrate is used. The horizontal axis represents a ratio between the support substrate and the piezoelectric substrate, i.e., (support substrate thickness)/(LiTaO$_3$ or LiNbO$_3$ crystal substrate thickness).

The temperature coefficients of frequency for a structure in which an Al groove electrode is provided only on the support substrate are −45 ppm/° C. and −100 ppm/° C. for the LiTaO$_3$ crystal and the LiNbO$_3$ crystal, respectively, while using a support substrate having a linear expansion coefficient of 0.5×10⁻⁶/° C. when the thickness ratio of piezoelectric substrate/support substrate is 2.5 or greater may improve the temperature coefficients of frequency for the LiTaO₃ crystal and the LiNbO₃ crystal to be better than −25 ppm/° C. and −35 ppm/° C., respectively. Using a support substrate having a linear expansion coefficient of 3.35×10⁻⁶/° C. when the thickness ratio of piezoelectric substrate/support substrate is 4 or greater, using a support substrate having a linear expansion coefficient of 8.4×10⁻⁶/° C. when the thickness ratio of piezoelectric substrate/support substrate is 6.7 or greater, and using a support substrate having a linear expansion coefficient of 10.4×10⁻⁶/° C. when the thickness ratio of piezoelectric substrate/support substrate is 8 or greater may improve the temperature coefficients of frequency for the LiTaO₃ crystal and the LiNbO₃ crystal to be better than −25 ppm/° C. and −35 ppm/° C., respectively. The relationship between the linear expansion coefficient α and the thickness ratio TR of piezoelectric substrate/support substrate can be expressed in Equation (2) below.

$$TR = \alpha \times 0.55 \times 10^6 + 2.18 \quad (2)$$

Accordingly, a piezoelectric substrate and a support substrate that satisfy the thickness ratio of piezoelectric substrate/support substrate greater than TR obtained by Equation (2) can be used. Even if a SiO₂ film, SiO compound film, or acoustic multi-layer film is interposed between the piezoelectric substrate and the support substrate, TR can be calculated from a thickness-based average of the respective linear expansion coefficients and a total thickness. A support substrate having a linear expansion coefficient of 10.4×10⁻⁶/° C. or less, i.e., a linear expansion coefficient smaller than that of a LiTaO₃ or LiNbO₃ crystal substrate as shown in Table 2, is preferably used, and a linear expansion coefficient smaller than this amount is more preferable for the support substrate.

REFERENCES SIGNS LIST

10 High-order mode surface acoustic wave device
11 Piezoelectric substrate
12 Interdigital transducer (IDT) electrode
13 Film
14 Support substrate
15 Multi-layer film

What is claimed is:

1. A high-order mode surface acoustic wave device comprising:
a piezoelectric substrate including LiTaO₃ or LiNbO₃ crystal;
an interdigital transducer electrode embedded in a surface of the piezoelectric substrate; and
a support substrate provided on a surface opposite to the surface of the piezoelectric substrate on which the interdigital transducer electrode is provided, such that a high-order mode surface acoustic wave is supported with the support substrate allowing a transverse sound velocity or equivalent transverse sound velocity in a range from 2000 to 3000 m/s or from 6000 to 8000 m/s with the piezoelectric substrate having a thickness in a range from 0.2 to 20 wavelengths, or the support substrate allowing a transverse sound velocity or equivalent transverse sound velocity in a range from 3000 to 6000 m/s with the piezoelectric substrate having a thickness in a range from 2 to 20 wavelengths.

2. The high-order mode surface acoustic wave device of claim 1 wherein the interdigital transducer electrode is formed to be non-coplanar with the surface of the piezoelectric substrate.

3. The high-order mode surface acoustic wave device of claim 1 further comprising a film provided in contact with the piezoelectric substrate.

4. The high-order mode surface acoustic wave device of claim 1 further comprising a multi-layer film provided on the surface of the piezoelectric substrate opposite to the surface on which the interdigital transducer electrode is provided.

5. The high-order mode surface acoustic wave device of claim 4 wherein the support substrate includes a material other than metal.

6. The high-order mode surface acoustic wave device of claim 5 wherein the support substrate includes at least one of Si, quartz, sapphire, glass, silica, germanium, and alumina.

7. The high-order mode surface acoustic wave device of claim 4 wherein the multi-layer film includes an acoustic multi-layer film that a plurality of layers having different acoustic impedances are stacked into.

8. The high-order mode surface acoustic wave device of claim 1 wherein the interdigital transducer electrode has a metallization ratio of 0.45 or greater.

9. The high-order mode surface acoustic wave device of claim 8 wherein the interdigital transducer electrode has a metallization ratio of 0.63 or greater.

10. The high-order mode surface acoustic wave device of claim 1 wherein the piezoelectric substrate includes a LiTaO₃ crystal, the interdigital transducer electrode including at least one of Ti, Al, and Mg alloys and being embedded from the surface of the piezoelectric substrate to a depth in a range from 0.15 to 0.6 wavelength with a metallization ratio of 0.5.

11. The high-order mode surface acoustic wave device of claim 1 wherein the piezoelectric substrate includes a LiTaO₃ crystal, the interdigital transducer electrode including at least one of Ag, Mo, Cu, Ni, Pt, Au, W, Ta, and Hf and being embedded from the surface of the piezoelectric substrate to a depth in a range from 0.16 to 0.6 wavelength with a metallization ratio of 0.5.

12. The high-order mode surface acoustic wave device of claim 1 wherein the piezoelectric substrate includes a LiTaO₃ crystal, the interdigital transducer electrode including at least one of Ti, Al, and Mg alloys and being embedded from the surface of the piezoelectric substrate to a depth in a range from 0.23 to 0.6 wavelength with a metallization ratio of 0.5.

13. The high-order mode surface acoustic wave device of claim 1 wherein the piezoelectric substrate includes a LiTaO₃ crystal, the interdigital transducer electrode including at least one of Ag, Mo, Cu, and Ni and being embedded from the surface of the piezoelectric substrate to a depth in a range from 0.18 to 0.6 wavelength with a metallization ratio of 0.5.

14. The high-order mode surface acoustic wave device of claim 1 wherein the piezoelectric substrate includes a LiTaO₃ crystal, the interdigital transducer electrode including at least one of Ag, Mo, Cu, Ni, Pt, Au, W, Ta, and Hf and being embedded from the surface of the piezoelectric substrate to a depth in a range from 0.25 to 0.6 wavelength with a metallization ratio of 0.5.

15. The high-order mode surface acoustic wave device of claim 1 wherein the piezoelectric substrate includes a LiNbO₃ crystal, the interdigital transducer electrode including at least one of Ti, Al, and Mg alloys and being embedded from the surface of the piezoelectric substrate to a depth in a range from 0.14 to 0.6 wavelength with a metallization ratio of 0.5.

16. The high-order mode surface acoustic wave device of claim 1 wherein the piezoelectric substrate includes a LiNbO$_3$ crystal, the interdigital transducer electrode including at least one of Ag, Mo, Cu, and Ni and being embedded from the surface of the piezoelectric substrate to a depth in a range from 0.13 to 0.6 wavelength with a metallization ratio of 0.5.

17. The high-order mode surface acoustic wave device of claim 1 wherein the piezoelectric substrate includes a LiNbO$_3$ crystal, the interdigital transducer electrode including at least one of Pt, Au, W, Ta, and Hf and being embedded from the surface of the piezoelectric substrate to a depth in a range from 0.15 to 0.6 wavelength with a metallization ratio of 0.5.

18. The high-order mode surface acoustic wave device of claim 1 wherein the piezoelectric substrate includes a LiNbO$_3$ crystal, the interdigital transducer electrode including at least one of Ti, Al, and Mg alloys and being embedded from the surface of the piezoelectric substrate to a depth in a range from 0.21 to 0.6 wavelength with a metallization ratio of 0.5.

19. The high-order mode surface acoustic wave device of claim 1 wherein the piezoelectric substrate includes a LiNbO$_3$ crystal, the interdigital transducer electrode including at least one of Ag, Mo, Cu, and Ni and being embedded from the surface of the piezoelectric substrate to a depth in a range from 0.18 to 0.6 wavelength with a metallization ratio of 0.5.

20. The high-order mode surface acoustic wave device of claim 1 wherein the piezoelectric substrate includes a LiNbO$_3$ crystal, the interdigital transducer electrode including at least one of Pt, Au, W, Ta, and Hf and being embedded from the surface of the piezoelectric substrate to a depth in a range from 0.23 to 0.6 wavelength with a metallization ratio of 0.5.

21. The high-order mode surface acoustic wave device of claim 1 wherein the piezoelectric substrate includes a LiTaO$_3$ crystal, the Euler angles being in a range of (0°+/−20°, 112° to 140°, 0°+/−5°) or crystallographically equivalent Euler angles thereto.

22. The high-order mode surface acoustic wave device of claim 1 wherein the piezoelectric substrate includes a LiTaO$_3$ crystal, the Euler angles being in a range of (0°+/−10°, 120° to 132°, 0°+/−5°) or crystallographically equivalent Euler angles thereto.

23. The high-order mode surface acoustic wave device of claim 1 wherein the piezoelectric substrate includes a LiNbO$_3$ crystal, the Euler angles being in a range of (0°+/−20°, 78° to 153°, 0°+/−5°) or crystallographically equivalent Euler angles thereto.

24. The high-order mode surface acoustic wave device of claim 1 wherein the piezoelectric substrate includes a LiNbO$_3$ crystal, the Euler angles being in a range of (0°+/−20°, 87° to 143°, 0°+/−5°) or crystallographically equivalent Euler angles thereto.

25. The high-order mode surface acoustic wave device of claim 1 wherein the support substrate is in direct contact with the piezoelectric substrate.

26. The high-order mode surface acoustic wave device of claim 1 further comprising a multi-layer film such that the multi-layer film is provided between the piezoelectric substrate and the support substrate.

27. A high-order mode surface acoustic wave device comprising:
   a piezoelectric substrate including LiTaO$_3$ or LiNbO$_3$ crystal;
   an interdigital transducer electrode embedded in a surface of the piezoelectric substrate; and
   a support substrate provided on a surface opposite to the surface of the piezoelectric substrate on which the interdigital transducer electrode is provided, such that a high-order mode surface acoustic wave is supported with the support substrate having a linear expansion coefficient of $10.4 \times 10^{-6}$/° C., a thickness ratio of the support substrate/the piezoelectric substrate being a value of TR or greater, TR being defined by TR=α× $0.55 \times 10^{-6}$+2.18 where α is a linear expansion coefficient.

* * * * *